(12) United States Patent
Marcus et al.

(10) Patent No.: US 7,424,389 B2
(45) Date of Patent: *Sep. 9, 2008

(54) MEASURING LAYER THICKNESS OR COMPOSITION CHANGES

(75) Inventors: Michael A. Marcus, Honeoye Falls, NY (US); Steven C. Switalski, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/779,570

(22) Filed: Jul. 18, 2007

(65) Prior Publication Data

US 2007/0260422 A1 Nov. 8, 2007

Related U.S. Application Data

(62) Division of application No. 11/262,868, filed on Oct. 31, 2005, now Pat. No. 7,277,819.

(51) Int. Cl.
*G01D 1/00* (2006.01)

(52) U.S. Cl. .................................... 702/172

(58) Field of Classification Search ............... 702/170, 702/172, 166; 356/630, 632, 450, 477, 479, 356/496, 497, 503
See application file for complete search history.

(56) References Cited

U.S. PATENT DOCUMENTS

| 6,513,451 | B2 | 2/2003 | Van Slyke et al. | |
|---|---|---|---|---|
| 6,646,753 | B2 | 11/2003 | Zhang et al. | |
| 7,277,819 | B2* | 10/2007 | Marcus et al. | 702/170 |
| 2002/0097406 | A1* | 7/2002 | Fielden et al. | 356/630 |
| 2003/0169433 | A1 | 9/2003 | Koele et al. | |
| 2004/0008435 | A1 | 1/2004 | Takahashi et al. | |
| 2004/0131300 | A1 | 7/2004 | Atanasov | |
| 2004/0239953 | A1 | 12/2004 | Flynn | |
| 2005/0046850 | A1 | 3/2005 | Chow | |
| 2006/0012582 | A1 | 1/2006 | De Lega | |

FOREIGN PATENT DOCUMENTS

JP 2004134154 4/2004

* cited by examiner

*Primary Examiner*—Tung S. Lau
*Assistant Examiner*—Xiuquin Sun
(74) *Attorney, Agent, or Firm*—Raymond L. Owens

(57) ABSTRACT

A method of measuring the thickness or the rate of change of thickness of a layer as the layer is being formed on a substrate, includes illuminating the layer through the substrate with low coherence light that transmits through the layer; collecting a portion of the reflected light from each optical interface of the substrate and layer with a low coherence interferometer; and, calculating the thickness or the rate of change of thickness of the layer according to the obtained interferometric data.

17 Claims, 24 Drawing Sheets

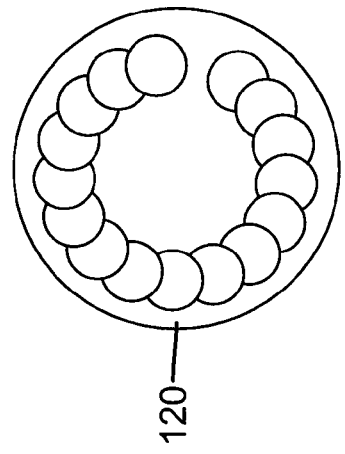
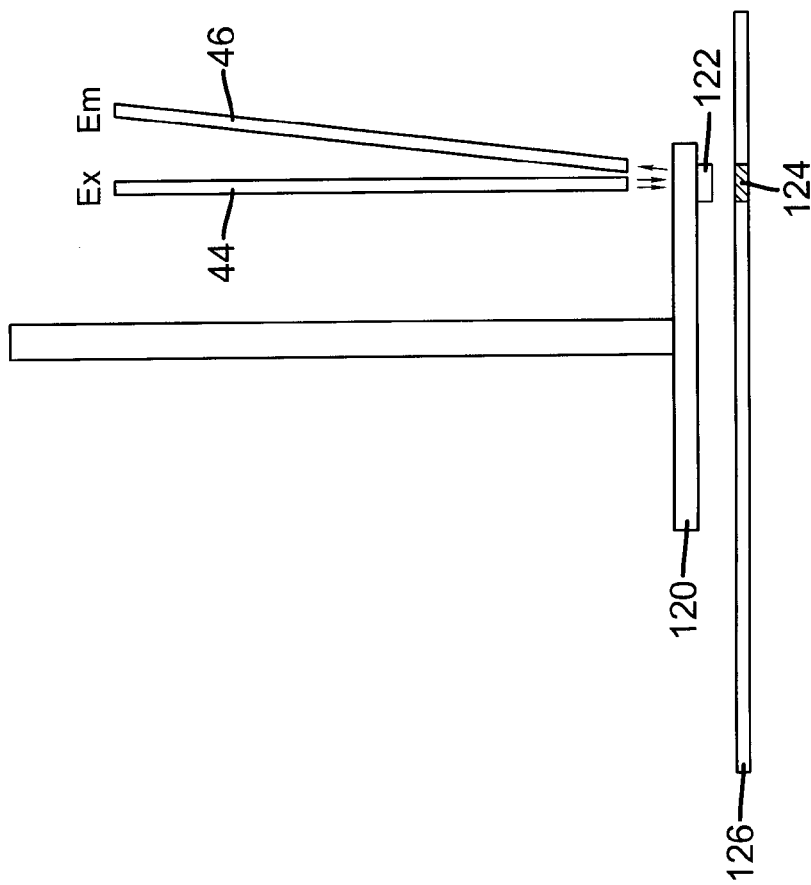
FIG. 10B
FIG. 10A

MEASURING LAYER THICKNESS OR COMPOSITION CHANGES

CROSS REFERENCE TO RELATED APPLICATION

This application is a divisional of commonly assigned U.S. patent application Ser. No. 11/262,868 filed Oct. 31, 2005 now U.S. Pat. No. 7,277,819.

FIELD OF THE INVENTION

The present invention relates to providing physical measurements of layer thickness and more particularly relates to measuring the thickness of a layer of material during or after it is deposited on a substrate and also relates to determining the relative concentration of a deposited component of the layer during or after deposition.

BACKGROUND OF THE INVENTION

Many types of optical and electro-optical elements require the deposition of at least one, but typically multiple patterned thin film coatings onto a substrate. In order to obtain the optimum performance from these optical and electro-optical elements and to achieve satisfactory fabrication yields, it is necessary to provide precise control over the materials deposition process. One key aspect of this control relates to monitoring and controlling the thickness and materials composition of each thin-film layer. Because of the critical dimensions involved, it is advantageous to be able to accurately measure thin film thickness and composition not only once the layer has been deposited, but also in situ, as the material is being deposited. That is, it is desirable to be able to measure layer thickness and rate of change of layer thickness as well as to determine the relative composition of layer component materials dynamically.

There are inherent difficulties that complicate the measurement process in the thin film deposition environment and that make some conventional approaches unworkable for in situ measurement. Chief among these problems is the materials deposition process itself. For many thin-film deposition techniques, any component in the deposition chamber will be coated to some degree. Thus, the performance of optical components and sensors will degrade over time due to deposition of material onto these control components.

This problem has been exhibited with so-called crystal mass-sensor devices, used in many thin-film development environments. In the crystal mass-sensor device, the monitor is a quartz crystal having two opposing electrodes. The crystal itself is part of an oscillator circuit provided in a deposition rate monitor. Within an acceptable range, a frequency of oscillation of the oscillator circuit is approximately inversely proportional to a mass loading on a surface of the crystal occasioned by a layer or by multiple layers of material deposited on the crystal. This works acceptably, for a time. However, when the acceptable range of mass-loading of the crystal is exceeded, for example by build-up of an excess number of deposited layers, the oscillator circuit can no longer function reliably, necessitating replacement of the "overloaded" crystal with a new crystal mass-sensor. Such replacement, in turn, requires discontinuation of the vapor deposition process. In addition, when certain organic layers are deposited onto crystal mass-sensor devices there can be a tendency for the layers to start cracking and flaking from the mass sensor surface after coating thickness build-up on the order of 500-2,000 nanometer (nm). This can cause the crystal mass-sensor to become inaccurate in its coating rate measurement capability at thicknesses well below the aforementioned mass-loading limit. Thus, although the crystal mass-sensor device provides an acceptable solution for prototype and development work, this type of device, deteriorating with use and requiring regular replacement, would not be well suited for mass fabrication environments.

Similarly, deposition of material onto control and sensing components also has an impact on solutions that employ optical methods for in situ thickness sensing. Lenses, photosensors, or other optical components that are exposed within the deposition chamber are all subject to this problem. For this reason, a number of solutions propose the use of a surrogate "witness plate" that can be subjected to the deposition process and removed after a period in order to allow accurate layer measurement outside the deposition chamber. However, such a solution requires space in the deposition environment, requires an interface for its removal and reinsertion, introduces additional surface area and waste, and necessitates time delay so that the ability to obtain dynamic measurement data is compromised.

Among optical solutions for measurement that have been proposed is in situ fluorescence. For example, commonly assigned U.S. Pat. No. 6,513,451 entitled "Controlling The Thickness Of An Organic Layer In An Organic Light-Emitting Device" to Van Slyke et al. discloses a thin-film measurement method using a rotating disk member whose rotation exposes it to the deposition environment and also to monitoring and disk cleaning apparatus mounted just outside the chamber. Although this method resolves a number of difficulties, however, it requires that the area to be measured be a surrogate area rather than the device being formed and that this measured area be moved out of the coating process to another position to be measured. Although fluorescence may provide a suitable mechanism for measurement with some types of coatings, this method may have limited uses with other types of thin-film materials.

In another measurement method, U.S. Pat. No. 6,646,753 B2 entitled "In-Situ Thickness And Refractive Index Monitoring And Control System For Thin Film Deposition" to Zhang et al. discloses a transmission type measurement in which laser light sources at 2 distinct wavelengths are measured, with blocked beam and unattenuated. These measurements are used to obtain data on either index of refraction or thickness of the coating, or both. Optical measurements are made outside of the deposition area, using viewports in a vacuum deposition chamber.

U.S. Patent Publication No. 2004/0239953 entitled "Optical Method Measuring Thin Film Growth" to Flynn describes a method of measuring the rate of change of optical thickness of a thin-film during deposition in transmission by looking for the change in location of the transmission maximum wavelength caused by interference effects as a function of coating thickness. This approach is then used to sense the deposition rate by tracking the peaks in the transmission spectrum as a function of time.

US Patent Publication 2004/0008435 A1 entitled "Optical Film Thickness Controlling Method, Optical Film Thickness Controlling Apparatus, Dielectric Multilayer Film Manufacturing Apparatus, and Dielectric Multilayer Film Manufactured Using the Same Controlling Apparatus or Manufacturing Apparatus" by Takahashi et al. describes a method of determining layer thickness for dielectric layers from a transmission measurement using monochromatic light directed through a chamber window, and applying a calculation involving the reciprocal of the transmittance as a function of coating thickness.

Japanese application JP2004134154A entitled "Organic EL Device and its Production Method" assigned to Sanyo Electric Co Ltd., to S. Masakuzu, T. Teiji, and I. Hiroaki, describes a method for measurement and control of dopant concentration in a host material layer by measuring the fluorescent spectrum or light absorption spectrum of the layer. The '4154 Masakuzu et al. application also describes a control loop using in situ feedback on relative concentrations, allowing coating process adjustment. Dopant concentration is determined from the fluorescence spectrum by measuring at the wavelength that shows the maximum fluorescence intensity. The light absorbance is then used to determine the host concentration. The light source may be on either side of the substrate. However, there is no acknowledgement of the problem of keeping the light source clean from contamination in this in situ arrangement or of maintaining equal power throughout the process.

U.S. Patent Application No. 2004/0131300 by Atanasov entitled "Optical Monitoring of Thin Film Deposition" describes an optical monitoring system for monitoring thin film deposition on a substrate comprising a bridge supporting a pair of facing fiber optic collimators for a transmission measurement through a substrate.

U.S. Patent Application 2005/0046850 A1 entitled "Film Mapping System" by Chow describes a material's property measuring system for monitoring the reflection and transmission of electromagnetic radiation from a sample using a complex optical system with beamsplitters that spread light over the sample surface and using a detector array.

Although the methods described in the above listing may provide some measure of accuracy in determining layer thickness, there is a significant need for improvement. For example, approaches such as those outlined in the Chow '6850 application and '1300 Atanasov application are not suited to in situ measurement. In situ measurement would provide the most highly accurate data for determining the rate of change of deposition, useful in maintaining precision control of the deposition process. The '4154 Masakuzu et al. application does not address the problem of contamination from deposited material. More significantly, the methods described in the above-cited patent literature may perform adequately for single layer deposition, but do not work as well in measurement for components having multiple overlaid patterned layers.

SUMMARY OF THE INVENTION

The present invention provides a method of measuring the thickness or the rate of change of thickness of a layer as the layer is being formed on a substrate, comprising:

a) illuminating the layer through the substrate with low coherence light that transmits through the layer;

b) collecting a portion of the reflected light from each optical interface of the substrate and layer with a low coherence interferometer; and, c) calculating the thickness or the rate of change of thickness of the layer according to the obtained interferometric data.

The present invention advantageously enables measurement of coating thickness and deposition rate, as well as of material composition of a coating during the deposition process.

It is an advantage of the present invention that the total laydown thickness on an active device can be measured in-situ during coating, without the need of moving the sample to a separate measurement zone. Further, multilayered coatings can be measured in situ.

As a further advantage, the method of the present invention allows real-time monitoring of the deposition rate, useful in a control loop that regulates the laydown rate.

As a further advantage, the composition of a layer can also be determined when the layer consists of a host material and at least one dopant material.

As a further advantage, when using witness plates and masks, it is possible to employ built in reference materials.

BRIEF DESCRIPTION OF THE DRAWINGS

FIG. 10 shows the internal vacuum setup of fiber optics used for fluorescence measurements;

DETAILED DESCRIPTION OF THE INVENTION

Low coherence interferometry or fluorescence spectroscopy can be utilized to measure materials deposition thickness and rate of change for thin-film coating of materials in situ, during the coating process. The optical methods and apparatus of the present invention are particularly well suited to coating for Optical Light Emitting Diode (OLED) fabrication; however, these same methods could be applied for forming other types of devices as well.

Figure 1:
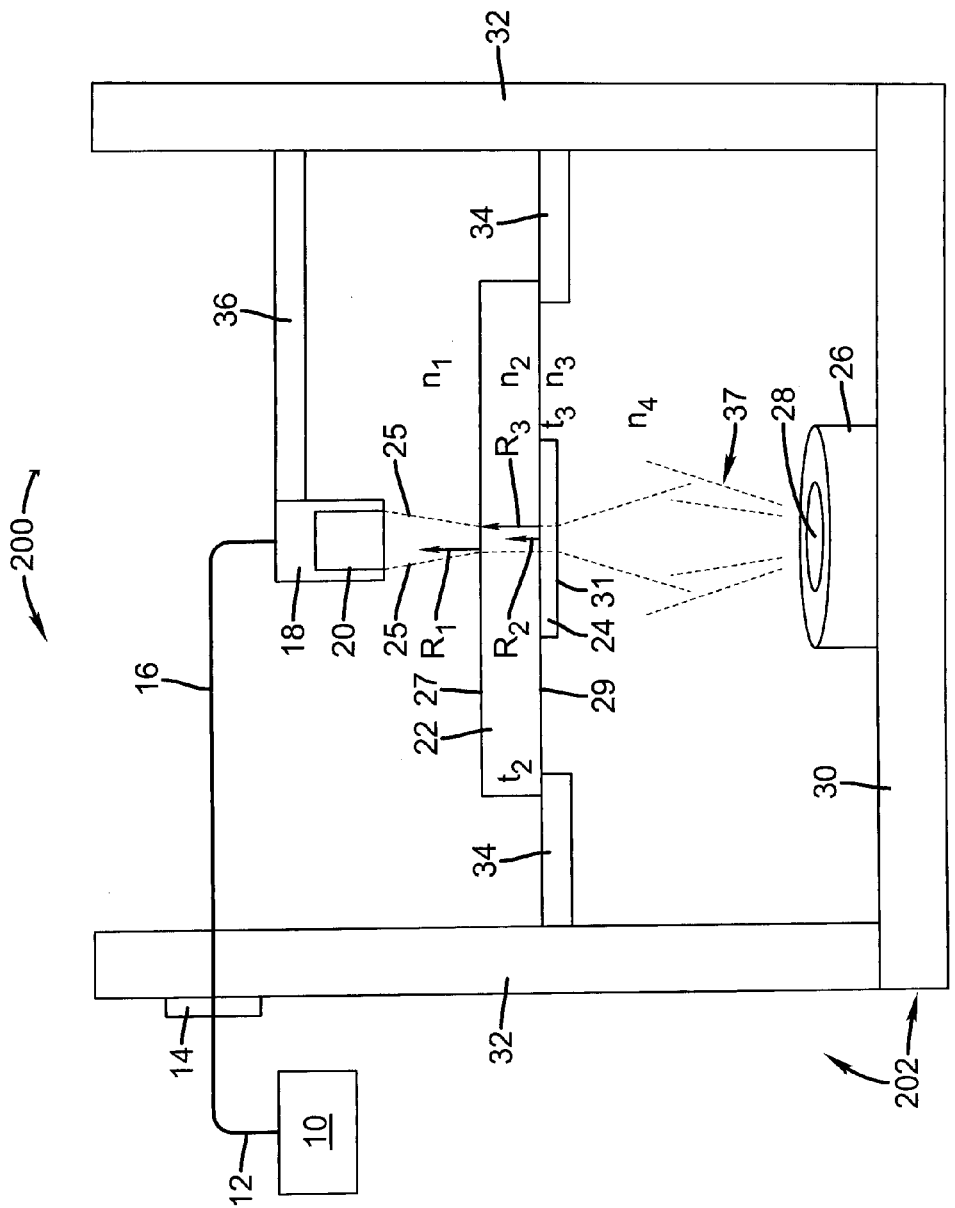
FIG. 1 is a block diagram showing one embodiment of a measurement system for performing in-situ low coherence interferometry measurements of deposition thickness and deposition rates directly on a substrate as it is being coated.

The block diagram of FIG. 1 shows an embodiment of a measurement system 200 for performing low coherence interferometry measurements of deposition thickness and deposition rates directly on a substrate 22 as it is being coated. A coating deposition source 26, loaded with the material to be deposited, is mounted to a vacuum chamber base 30 in the embodiment shown. A vacuum chamber 202 has side walls 32 attached to chamber base 30. The rest of the enclosure is not shown, but it is understood that deposition is usually performed in a controlled pressure environment. Deposition source 26 has an orifice 28 from which a vapor plume 37 of the material being coated is emitted toward substrate 22 to deposit a coating layer 24 onto substrate 22. Substrate 22 is held in place by a substrate support member 34 that is attached to the walls 32 or base 30 of vacuum chamber 202. Low coherence light (generally, light having a short coherence length, such as a coherence length typically on the order of about 8 to 20 microns) from a low coherence light interferometer apparatus 10 is transmitted along an optical fiber 12 which is coupled to a fiber optic feedthrough 14 attached to vacuum chamber wall 32. Chamber optical fiber 16 is attached to fiber optic feedthrough 14 and is coupled to an optical probe 18, which is mounted in the vacuum chamber by a probe mount 36. Optical probe 18 also includes a lens 20 which focuses light onto substrate 22 and coating layer 24 and collects at least a portion of the reflected light from each of optical interfaces 27, 29, and 31 of substrate 22 and its coatings. Preferably optical probe 18 is normal to substrate 22. A light beam path 25 shows the path of the light after passing through lens 20 toward substrate 22 and coating 24, on the opposite surface. Light is reflected back into lens 20 of optical probe 18 and back into interferometer apparatus 10 through optical fiber 16, fiber optic feedthrough 14 and optical fiber 12. Light is reflected from each of the optical interfaces in the path of the focal region of optical probe 18, including substrate to vacuum interface 27 with reflection coefficient $R_1$; substrate to coating interface 29 with reflection coefficient $R_2$; and coating to vacuum interface 31 with reflection coefficient $R_3$.

Interferometer Apparatus

Figure 4:
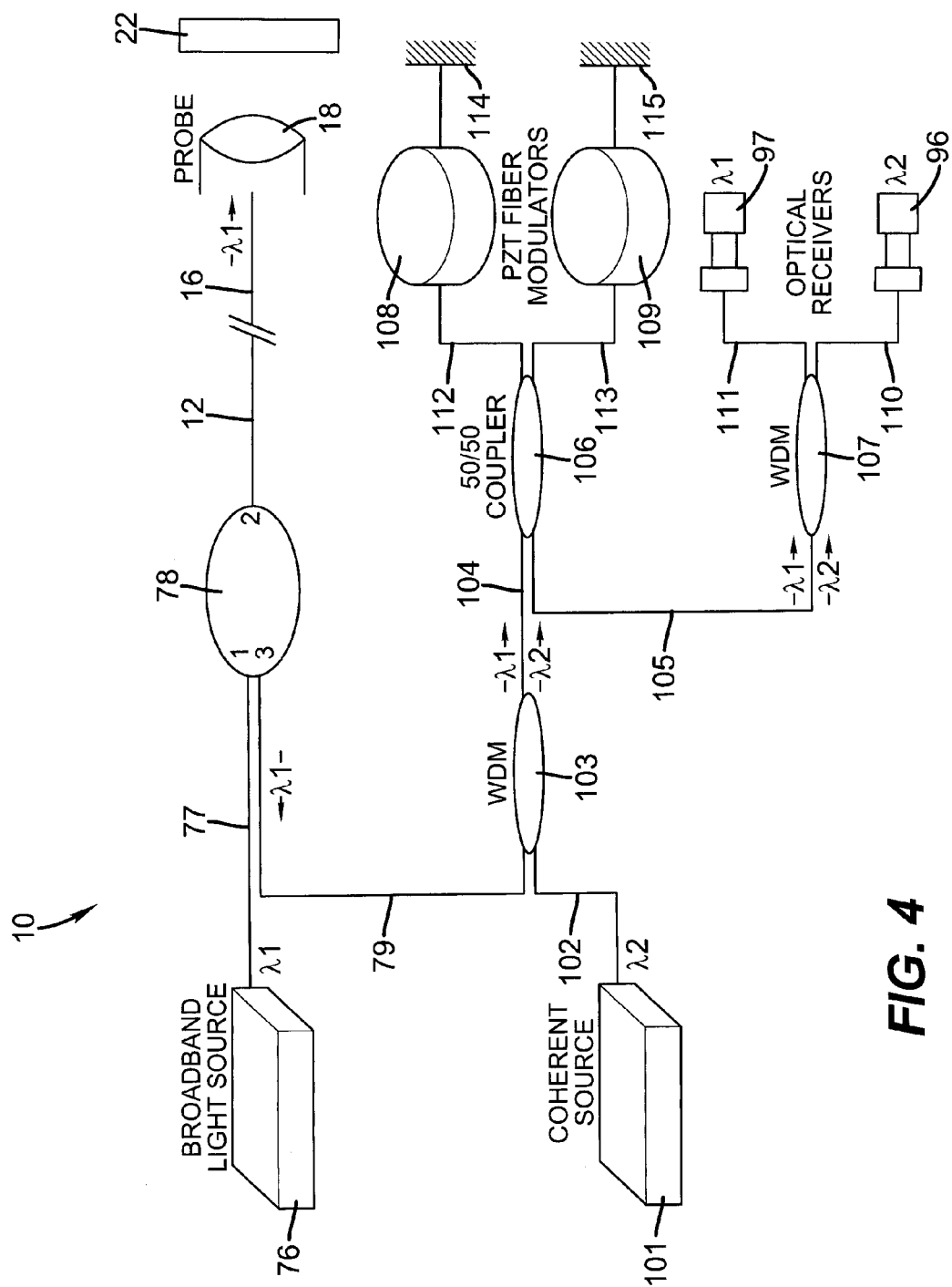
FIG. 4 shows a preferred embodiment of a low coherence interferometer used in the practice of this invention.

FIG. 4 shows an embodiment of interferometer apparatus 10 shown in FIG. 1 used in the practice of this invention. This is a dual fiber interferometer, which combines a low coherence light interferometer used to measure the sample, with a laser interferometer which is used to provide a distance scale during measurement as described in commonly assigned U.S. Pat. No. 5,596,409 entitled "Associated Dual Interferometric Measurement Method for Determining A Physical Property of an Object" and in U.S. Pat. No. 5,659,392 entitled "Associated Dual Interferometric Measurement Apparatus for Determining a Physical Property of an Object" both to Marcus et al. All of the fibers in the apparatus are single mode fibers and can also be polarization maintaining fibers. Low coherence light from a broadband light source 76 with a central wavelength $\lambda_1$ such as a 1300 nm broadband SLED is directed to substrate 22 by broadband source optical fiber 77 and into a fiber optical circulator 78 passing from port 1 to 2 into optical fiber 12. The circulator 78 directs the light from port 1 to port 2 and light from port 2 to port 3. Optical fiber 12 is coupled to chamber optical fiber 16 as shown in FIG. 1. Light from chamber optical fiber 16 is coupled to optical probe 18 and is focused onto substrate 22. During deposition, coating layer 24 (FIG. 1) is being deposited. Light reflected from the substrate 22 and coating layer 24 is collected by optical probe 18 and returns back down chamber optical fiber 16 into optical fiber 12, from port 2 to port 3 of fiber optic circulator 78, and into interferometer input optical fiber 79. Light passing through interferometer input optical fiber 79 passes through a wavelength division multiplexer (WDM) 103 and is input into an all fiber Michelson interferometer.

Light coming from coherent source 101 with wavelength $\lambda_2$ which is preferably a temperature stabilized single mode laser diode operating at a wavelength of about 1550 nm is coupled to coherent source optical fiber 102. Light passing through coherent source optical fiber 102 is coupled into the WDM 103 which combines the low coherence light traveling down interferometer input optical fiber 79 with the coherent light traveling down coherent source optical fiber 102. The combined light travels down the WDM exit optical fiber 104 and is input into a 50/50 fiber optic coupler 106. The output of coupler 106 is split into a pair of interferometer arm optical fibers 112 and 113, which make up the two arms of the Michelson interferometer. Fibers 112 and 113 are coiled around a pair of piezoelectric modulators 108 and 109 respectively, which are operated in a push-pull fashion to alternately change the effective optical path length along optical fibers 112 and 113. Piezoelectric modulators 108 and 109 are driven with sine or triangle waveforms preferably at frequencies in the range of 10 Hz to 1 kHz; path length differences of up to 10 mm. Mirrors 114 and 115, preferably Faraday rotator mirrors, are coupled to the distal ends of optical fibers 112 and 113 to reflect light back into the 50/50 coupler 106. The returning light beams from fibers 112 and 113 interfere with each other and the coupler 106, modulators 108 and 109, fibers 112 and 113 and mirrors 114 and 115 form an all fiber Michelson interferometer. The interfering light from substrate 22 and coating 24 and from coherent source 101 returning from 50/50 coupler 106 travels along a detection optical fiber 105 and is split into two wavelength components by second wavelength division multiplexer 107. The laser light coming out of second WDM 107 travels down a coherent detection optical fiber 110 into a laser interference detector 96 and the low coherence light coming out of WDM 107 travels down low coherence detection optical fiber 111 into low-coherence light interference detector 97.

Figure 5:
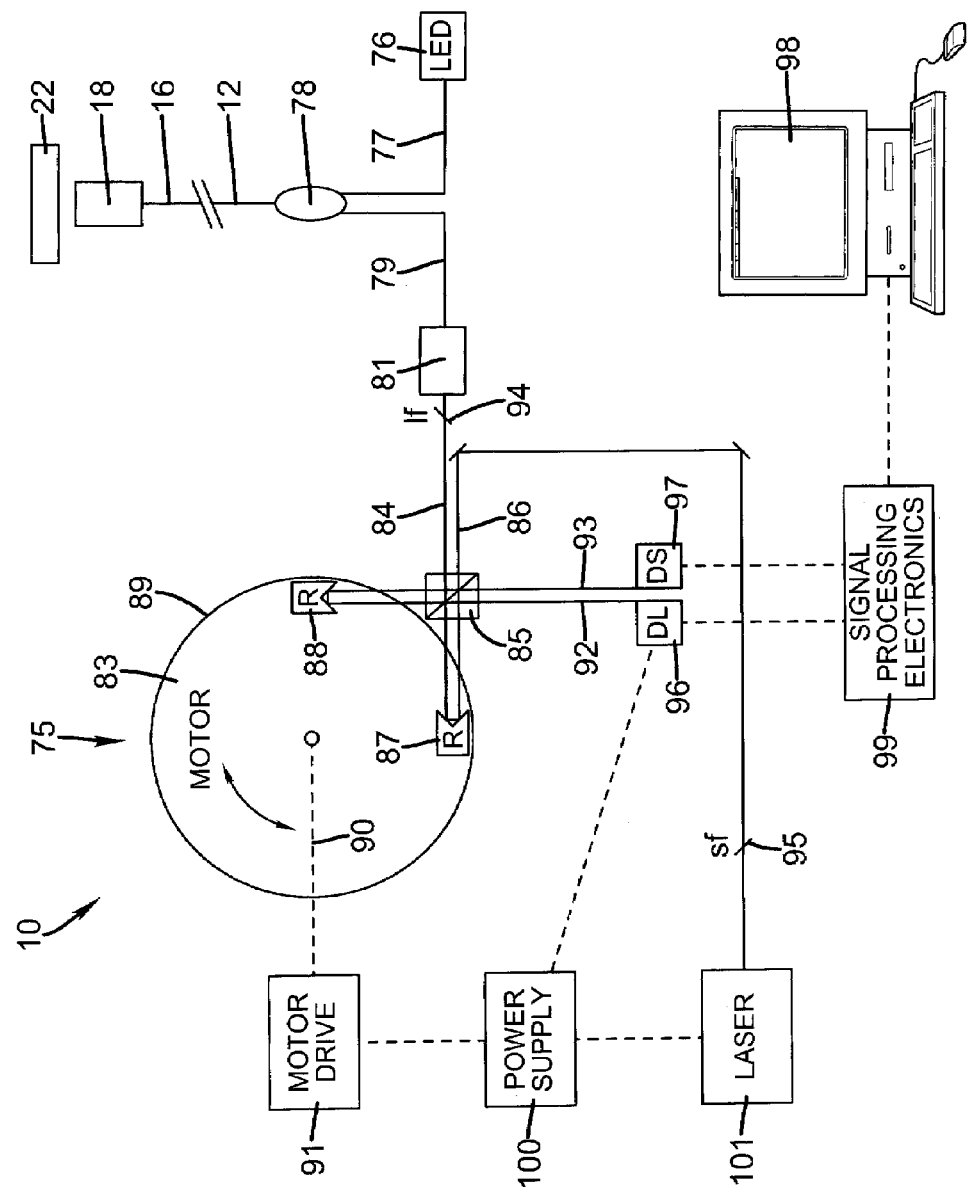
FIG. 5 shows an alternate embodiment of a low coherence interferometer used for the practice of this invention.

Referring now to FIG. 5, there is shown a schematic diagram of a second dual Michelson interferometer apparatus 10 suitable for use in practicing this invention, which also includes a first low-coherence light interferometer and a second coherent light interferometer. Interferometer apparatus 10 includes a first rotating head Michelson interferometer (or other optical autocorrelator or interferometer having a variable differential time delay) set up in an optical autocorrelation configuration mode. Low coherence light from a 1300 nm broadband light source 76 such as a 1300 nm (SLED) is directed to substrate 22 and coating layer 24 (FIG. 1) by broadband source optical fiber 77 through fiber optic circulator 78 into probe optical fiber 77. Optical fiber 12 is coupled to chamber optical fiber 16 as shown in FIG. 1. Light from chamber optical fiber 16 is coupled to optical probe 18 and is focused onto substrate 22. During deposition coating layer 24 (not shown) is being deposited. Light reflected from the substrate 22 and coating layer 24 is collected by optical probe 18 and returns back down chamber optical fiber 16 into optical fiber 12 and passes through fiber optic circulator 78 into interferometer input optical fiber 79. Light reflected from the substrate 22 and coating layer 24 is introduced into both arms of a bulk Michelson interferometer 75 through interferometer input optical fiber 79 after being collimated by a collimator 81.

Coherent light generated by coherent source 101 shares some of the same elements as the first interferometer and is utilized to track the distance over which the optical path of the first interferometer changes as a rotating optical head 83 rotates to change the path lengths of the arms of the interferometer.

Light from the low-coherent broadband light source 76 is focused onto substrate 22 through optical focusing probe 18. Some light is reflected off each optical surface of substrate 22 and coating layer 24 and is reflected back into bulk Michelson interferometer 75. All of these reflected light signals pass back through optical probe 18, are sent back down the same optical fibers 16 and 12 and pass through circulator 78 and into interferometer input optical fiber 79, and are then collimated by collimator 81. These signals are introduced into rotating optical head 83 of interferometer 75 as a top beam 84 on the right side of a beam splitter cube 85. Interferometer 75 is set up in a bulk Michelson configuration. Solid lines in FIG. 5 indicate the light paths. There is also a second light path for a reference beam (bottom beam) 86 (preferably generated by a helium neon laser at coherent source 101, having a wavelength $\lambda=632.991\pm0.0005$ nm), which arrives at beam splitter cube 85 as bottom beam 86 on the right side (in the FIG. 5 configuration).

A pair of hollow-cube retroreflectors 87 and 88 are mounted 90° apart on a rotatable platform 89, preferably having a diameter of about 87 mm. Beam splitter cube 85 divides the laser and LED beams into pairs of light beams directed toward hollow retroreflectors 87 and 88. Hollow retroreflectors 87 and 88 are pre-aligned to form the two reflective arms of the Michelson interferometer with respect to beam splitter cube 85. Rotating a shaft 90 connected to the platform 89 causes the path length of one arm to increase while the path length of the other arm decreases by the same amount. A brushless DC motor drive 91 attached to shaft 90 of the platform produces the rotation. Power supply 100 provides power to motor drive 91, to laser 82, to LED 76 and to the other elements of the apparatus requiring electrical power. The interfering output beams 92 and 93 of the bulk Michelson interferometer are applied to the pair of detectors 96 and 97, for the laser light and for the low-coherence light beam respectively. A laser notch filter 94 is used to block the light from coherent light source 101 from being incident on the measurement substrate 22 and coating layers 24. A bandpass filter 95 is used to prevent light from broadband light source 76, reflected from the substrate 22, from entering the laser cavity of coherent light source 101.

During operation, rotating head motor drive 91 is cycled to alternately increase and decrease the optical path difference in the interferometer. Light signals from both coherent light source 101 and low coherence broadband light source 76 traverse the same optical path length in the interferometer arms, but in reverse order as they travel to and from the pair of retroreflectors 87 and 88. The beam from the HeNe laser of coherent light source 101 enters beam splitter 85 from the lower right side (in the orientation shown in FIG. 5) and is split into two beams at the lower right intersection point, which travel to the left and up respectively as shown in FIG. 5. The laser beam traveling to the left from beam splitter 85 goes to horizontal retroreflector 87, entering from the bottom right and arriving back at beam splitter 85 on the top left. The laser beam traveling to top retroreflector 88 arrives on the bottom right side and returns to beam splitter 85 on the top left side where the two laser beams are recombined. The recombined laser beams interfere with each other, and are split into two beams at beam splitter 85. One beam goes to laser detector 96 and the other one travels to the right. The recombined laser beam traveling to the right from the top left intersection point is blocked by laser notch filter 94 thereby preventing laser light from illuminating substrate 22.

As motor shaft 90 rotates, the optical path lengths of the two arms of the interferometer change simultaneously, and interference fringes occur every half wavelength of optical path difference in laser detector 96. A similar analysis for the light coming from substrate 22 shows that it follows the same optical path, but in reverse order.

Data acquisition and analysis is performed utilizing a computer 98, containing appropriate hardware, such as National Instrument data acquisition cards in one embodiment. The periodicity of the laser light is utilized to track distance that the low-coherent light interferometer moves. In this embodiment, signal processing electronics 99 and data analysis routines running under Lab Windows CVI or a Labview program development environment (available from National Instruments) running on computer 98 are utilized to analyze low-coherent light interferograms resulting from reflections at optical interfaces in the sample.

The stabilized HeNe laser interferometer shown in FIG. 5 and the 1550 nm laser diode interferometer shown in FIG. 4 are both utilized to track the distance the optical path has changed during rotation of optical head 83 shown in FIG. 5 or during the push pull operation of piezoelectric modulators 108, 109 in the all fiber interferometer shown in FIG. 4. A threshold value on the laser signal is utilized to provide a sequence of data acquisition trigger signals at constant distance intervals for collecting interferometric data from the low-coherence light interferometer. Thus, the purpose of the laser interferometer is to track the distance the optical path in the interferometer has changed while the low-coherence light interferometer is collecting data from the sample.

For the low-coherence broadband light source 76, constructive interference occurs when the path lengths of the two arms in the interferometer are equal within a few coherence lengths. In order for constructive interference to occur, light must be reflected back into the interferometer from substrate 22 plus coating layers 24. This will occur at each optical interface in substrate 22 plus coating layers 24. The distance between adjacent interference peaks represents the optical thickness (group index of refraction (n) times the physical thickness) of materials, including air, in substrate 22 plus coating layers 24. For convenience, the combination of substrate 22 plus coating layers 24 is also referred to as the sample in this disclosure.

Since the instrument uses a stabilized laser light source for providing constant distance interval measurements, the instrument measures absolute optical path distance defined as (n) times thickness. The measurement configuration of the interferometer is the optical autocorrelation mode, in which light reflecting from the sample is input to both arms of the Michelson interferometer. In the autocorrelation mode, light reflecting from the sample is made to interfere with itself, and both arms of the interferometer see reflections from all of the optical interfaces in the sample. As the path lengths of the two arms of the interferometer are changed, a series of interference peaks are observed, indicating the optical path differences between adjacent optical interfaces. The self-correlation condition occurs when the two path lengths of the Michelson interferometer are equal, in which case all optical interfaces in the sample interfere constructively. The measured distance between the largest peak, at zero path length difference, and the first set of adjacent peaks is the shortest optical path difference in the sample.

Calculation Methods and Results

It is instructive to describe how the expected interferometric signals are derived and how the calculations are performed. It is assumed that there is minimal absorption and scattering in the material so that peak intensities are determined by reflection and transmission and index of refraction. Assume light intensity $I_o$ is incident on the 2 layer structure shown in FIG. 1. The index of refraction is $n_1$ above substrate 22 of thickness $t_2$ and index of refraction $n_2$. Coating layer 24 has thickness $t_3$ and index of refraction $n_3$. The index of refraction below coating layer 24 is $n_4$. There are three optical interfaces and the reflection intensities are as follows $$R_1 = \frac{(n_2 - n_1)^2}{(n_2 + n_1)^2}, R_2 = \frac{(n_3 - n_2)^2}{(n_3 + n_2)^2}, R_3 = \frac{(n_4 - n_3)^2}{(n_4 + n_3)^2} \quad (1)$$

Assuming there is no absorption and no scattering in the materials it can be assumed that the intensity on the first interface is $I_o$ the incident light intensity. The light intensity of the light transmitted into the top layer of the material is given by $$T_1 = I_o(1 - R_1) \quad (2)$$

Similarly the light intensity transmitted into the second layer is given by $$T_2 = T_1(1 - R_2) = I_o(1 - R_1)(1 - R_2) \quad (3)$$

And the light intensity being transmitted past the third optical interface is given by $$T_3 = T_2(1 - R_3) = I_o(1 - R_1)(1 - R_2)(1 - R_3). \quad (4)$$

In an interferometer which is set up in an optical autocorrelator configuration, the light that comes back from each optical interface interferes with light from each of the other optical interfaces. The signal coming back to the interferometer from the first optical interface $S_1$ is given by $$S_1 = I_o R_1 \quad (5),$$

the signal coming back to the interferometer from the second optical interface is given by $$S_2 = I_o R_2 (1 - R_1)^2 \quad (6)$$

and the signal coming back to the interferometer from the third optical interface is given by $$S_3 = I_o R_3 (1 - R_1)^2 (1 - R_2)^2 \quad (7).$$

For the interfaces in FIG. 1, intensity above the zero-crossing amplitude will be $S_1^2 + S_2^2 + S_3^2$, the intensity of the non zero-crossing peak occurring at position $n_2 t_2$ from the origin will be $S_1 S_2$, and the intensity of the non zero-crossing peak occurring at position $n_3 t_3$ from the origin will be $S_2 S_3$. There will also be a third peak at location $n_2 t_2 + n_3 t_3$ with intensity $S_1 S_3$.

The complete interferogram for this type of sample is given by $$S(x) = (S_1^2 + S_2^2 + S_3^2)e^{-kx^2}\cos\left(\frac{4\pi x}{\lambda}\right) + \quad (8)$$

$$S_1 S_2 \left(e^{-k(x-n_2 t_2)^2}\cos\left(\frac{4\pi(x - n_2 t_2)}{\lambda}\right) + \right.$$

$$\left. e^{-k(x+n_2 t_2)^2}\cos\left(\frac{4\pi(x + n_2 t_2)}{\lambda}\right)\right) +$$

$$S_2 S_3 \left(e^{-k(x-n_3 t_3)^2}\cos\left(\frac{4\pi(x + n_3 t_3)}{\lambda}\right) + \right.$$

$$\left. e^{-k(x+n_3 t_3)^2}\cos\left(\frac{4\pi(x - n_3 t_3)}{\lambda}\right)\right) +$$

$$S_1 S_3 \left(e^{-k(x-n_3 t_3 - n_2 t_2)^2}\cos\left(\frac{4\pi(x - n_3 t_3 - n_2 t_2)}{\lambda}\right) + \right.$$

$$\left. e^{-k(x+n_3 t_3 + n_2 t_2)^2}\cos\left(\frac{4\pi(x + n_3 t_3 + n_2 t_2)}{\lambda}\right)\right)$$

where $\lambda$ is the central wavelength of the light source and k and the rest of the relationships are derived below.

A treatment of interference of partially-coherent light is found in *Fundamentals of Photonics*, 1991 by B. Saleh and M. Teich. When two partially-coherent light beams interfere, the intensity of the combined beam I(x) as a function of distance x is given by:

$$I(x) = I_s + I_r + 2\sqrt{I_s I_r}|g_{sr}(x)|\cos\phi(x) \quad (9)$$

where $I_s$ and $I_r$ are the intensities of the individual light beams, $g_{sr}(x)$ is the normalized mutual coherence function and $\phi(x)$ is the phase difference between the two light waves. For NIR SLED light sources, the coherence function is Gaussian as a function of distance. For the case where the sample and reference beams are mutually coherent at location $x_o$, the third (interference) term in equation 9 called S(x) can be written as:

$$S(x) = I_o e^{-k(x-x_O)^2}\cos\left(\frac{4\pi(x - x_0)}{\lambda}\right) \quad (10)$$

where k is a constant which is related to the source coherence length. For a Gaussian distribution, the source coherence length ($L_C$) is given by the expression:

$$L_C = \frac{2\ln 2 \lambda^2}{\pi \Delta \lambda} \quad (11)$$

where $\Delta\lambda$ is the source spectral bandwidth. The coherence length defines the full width at half maximum of the Gaussian function in Equation 2. When $x - x_O = L_C/2$ the amplitude of the normalized Gaussian function = ½. The value of k which satisfies this relationship is $$k = \frac{4\ln 2}{L_C^2} = \frac{\pi^2 \Delta \lambda^2}{\ln 2 \lambda^4}. \qquad (12)$$

For a 1300 nm source with a 60 nm bandwidth, the coherence length is calculated to be 12.429 µm and $k=1.794747\times 10^{10}/$m$^2$.

Of central importance for signal processing is the development of a true peak location algorithm. The goal is to find the true envelope center of an interferogram (a Gaussian function times a cosine function) when the data are not sampled at the location of the true Gaussian maximum. This must also be performed in the presence of noise from the environment. A variety of alternatives were evaluated including use of beats from multiple wavelength sources, or choice of sampling rate, moment calculations, Gaussian peak analysis, up-conversion, envelope detection, and Hilbert Transform method and Fourier transform phase analysis. The Fourier transform phase analysis technique enables calculating the thickness of thin organic films coated on either silicon or glass substrates in the range from 10 Angstroms (1 nm) up to a few microns in thickness. The Fourier transform phase analysis technique is based on applying the Shift Theorem to a discrete Fourier transform data set. An article by B. Danielson and C. Boisrobert, entitled "Absolute Optical Ranging Using Low Coherence Interferometry", *Applied Optics,* 30, 2975, 1991 describes this approach. As taken from R. Bracewell, *The Fourier Transform and its Applications*, Second Edition, McGraw Hill Book Company, New York, 1978, the Fourier Shift Theorem can be stated as follows:

If f(x) has the Fourier Transform F(s), then f(x−a) has the Fourier Transform $e^{-2\pi ias}F(s)$.

The Fourier Transform F(s) of the function f(x) is given by:

$$F(s) = \int_{-\infty}^{\infty} f(x)e^{-2\pi i xs} dx \qquad (13)$$

where s is the frequency variable and x is the position coordinate. The Fourier Transform shift theorem can be written as:

$$\int_{-\infty}^{\infty} f(x-a)e^{-2\pi i xs} dx = e^{-2\pi i as} F(s) \qquad (14)$$

where a is the shift in the x coordinate. If δx is the sampling distance interval, P the calculated phase slope per point in the FFT centered around the frequency $f_o$ of maximum magnitude in the FFTs power spectrum, and N the number of points in the FFT, then it can be shown that:

$$P = \frac{2\pi a}{N \delta x}. \qquad (15)$$

The spatial frequency $f_o$ is calculated from the expression:

$$f_o = \frac{4(N/2-1)\delta x}{\lambda}. \qquad (16)$$

In-situ deposition monitoring experiments were performed using the interferometer apparatus shown in FIG. 4 with a 200 Hz measurement rate. Low coherence interferometric data was collected using zero-crossings of a 1550 nm laser diode as the coherent source 101 and as a data acquisition trigger which resulted in a sampling interval of $\lambda_o/4=0.3875$ µm for the low coherence data acquisition.

Figure 6A:
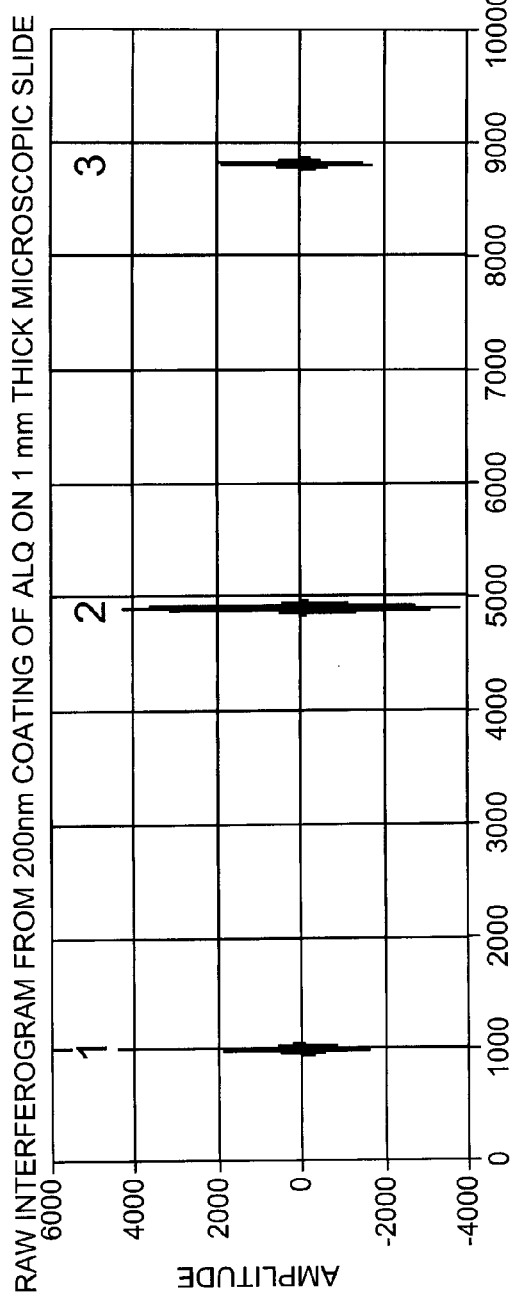
FIG. 6A shows a raw interferogram of data obtained during an in situ monitoring experiment using ALQ as the coating material on a glass substrate.
Figure 6B:
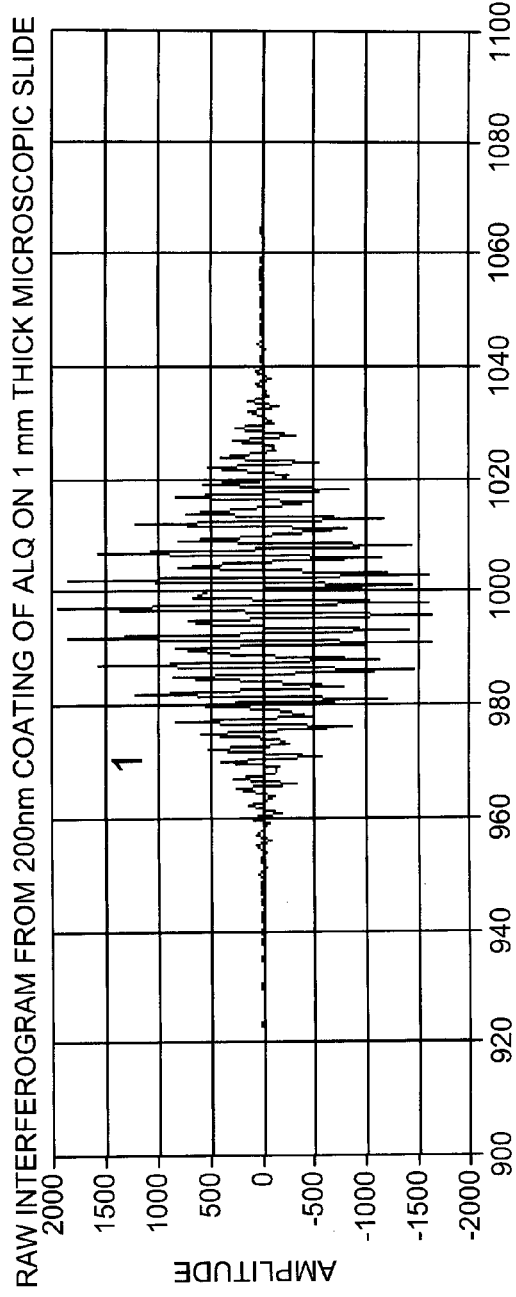
FIG. 6B shows interferogram data for peak 1 of FIG. 6A with an enlarged horizontal scale.

FIG. 6A shows a raw interferogram of data obtained during an in situ monitoring experiment using ALQ tris(8-hydroxyquinoline)aluminum as the coating material on a glass substrate. The raw interferogram was obtained when the ALQ coating layer thickness was 2000 Å (200 nm) on a 1 mm thick microscope slide substrate. The data shows one complete scan of the interferometer where the pathlength difference between the two arms of the interferometer changes from −1.9 to +1.9 mm. This data was obtained in 1/100 of a second. The x axis is the number of points acquired during data acquisition obtained at 0.3875 µm sampling intervals and the y axis shows the amplitude of the peaks. The second large amplitude peak labeled peak 2 is the zero-crossing peak of the interferogram and indicates the location at which the two pathlengths of the scanning arms of the interferometer are equal. The first and third peaks are the interference peaks where the top surface (substrate to vacuum interface) 27 of the substrate interferes with the substrate-to-coating interface 29 and the coating-to-substrate interface 31 (FIG. 1). Peaks 1 and 3 are termed side peaks. An expanded view of peak 1 data is shown in FIG. 6B. The distance between a side peak and the zero-crossing peak adjacent to it is the optical thickness of the substrate-plus-coating layer. To calculate the optical thickness of the coating layer subtract the thickness of the bare uncoated substrate, which is measured before coating starts, from the optical thickness of the substrate-plus-coating layer optical thickness. When the group index of refraction of the coating layer is known at the wavelength of measurement, we can calculate the thickness of the coating layer by dividing the measured optical thickness by the coating layer materials group index of refraction n at our measurement wavelength. Since the coating is much thinner than the coherence length of the low coherence light source there is no separate, distinct interference peak due to the coating. As the optical thickness of the coating layer 24 grows beyond about λ/2 of the low coherence source, thin film interference effects become apparent in the calculation of the peak locations.

In order to use the phase slope algorithm, an initial guess is made as to the x axis location of each of the interferogram peaks. This is done by choosing the location of the absolute value of the maximum amplitude of each of the peaks indicating optical interfaces in the interferogram as the location of the initial guess. A 256 point subset centered around this initial guess is taken and the first 128 points shifted to the end of the 256 point data subset are taken such that the most intense interferogram points are located at the beginning and end of this subset. To reduce noise and improve precision, data points in the middle of this array are set equal to zero (zero filling). The number of zero-filled points is dependent upon the bandwidth of the light source. For a 1550 nm laser and 1300 nm SLED with 50 nm bandwidth, zero fill the central 140 points of the shifted interferogram. The complex FFT of the zero-filled data array is taken and the resulting FFT values are transformed to polar coordinates (magnitude and phase). The center spatial frequency of the FFT is determined by locating the array index value corresponding to the data point having the maximum value of the magnitude spectrum. This frequency is checked for validity based upon expected frequency values obtained from equation (16). The center spatial frequency of the FFT is verified by determining if it falls within the acceptable range, and the phase slope calculation is performed by performing a linear least squares fit on the phase around the points centered on spatial frequency $f_o$. Phase unwrapping is required if the phase angle exceeds the range from $-\pi$ to $+\pi$. The phase measured at $f_o$ is used in equation (15) to calculate the true location of the peak by determining the shift $\delta x$ from the initial guess location $\alpha$. The distance between each set of adjacent peaks, such as peaks 1-2 and peaks 2-3 in FIG. 6A, gives the optical thickness of the substrate-plus-coating layer at the time the peaks are measured. For the data shown in FIG. 6A, the optical thickness measured by peaks 1-2 was measured 0.005 seconds before the optical thickness measured by peaks 2-3 of FIG. 6A. This process is repeated during the entire deposition monitoring sequence. In order to determine the thickness divide the measured optical thickness by the index of refraction of the layer material.

Low coherence interferometry has been found suitable for monitoring the rate of change of thickness and can measure total thickness when the initial uncoated substrate thickness is measured first. The rate of change of thickness of the layer is determined by using the peak locations of adjacent maxima determined at known different times, a first time $t_1$ and at a second time $t_2$, by the interferometer to measure total optical path which corresponds to the optical thickness of the substrate and the layer and subtracting the optical thickness of the substrate plus layer at the known different times and dividing by the difference in the known times $(t_2-t_1)$ to determine the rate of change in the optical thickness of the layer. This corresponds to taking the derivative of the change in thickness as a function of time.

Interferometer Deposition Monitoring Examples

Figure 7A:
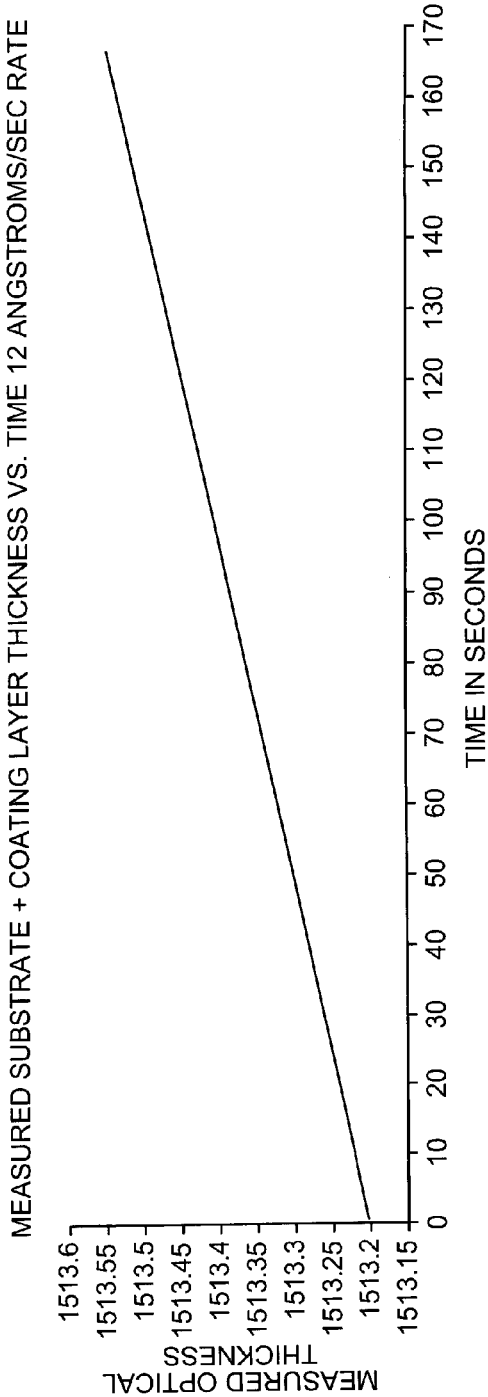
FIG. 7A shows optical thickness versus time data obtained during coating of ALQ at 12 Å/sec onto a glass substrate.

FIG. 7A shows optical thickness versus time data obtained during coating with ALQ at 12 Å/sec (1.2 nm/sec) onto a glass substrate about 1 mm thick using the apparatus shown in FIG. 1. The index of refraction of the glass substrate was 1.534 and the group index of refraction of ALQ at 1300 nm was determined to be 1.685. A shutter is interposed between the deposition source orifice 28 and the substrate 22 before coating is initiated. A quartz crystal monitor and deposition rate controller was also installed into the vacuum system for measuring and controlling deposition rates for calibration purposes.

Figure 7B:
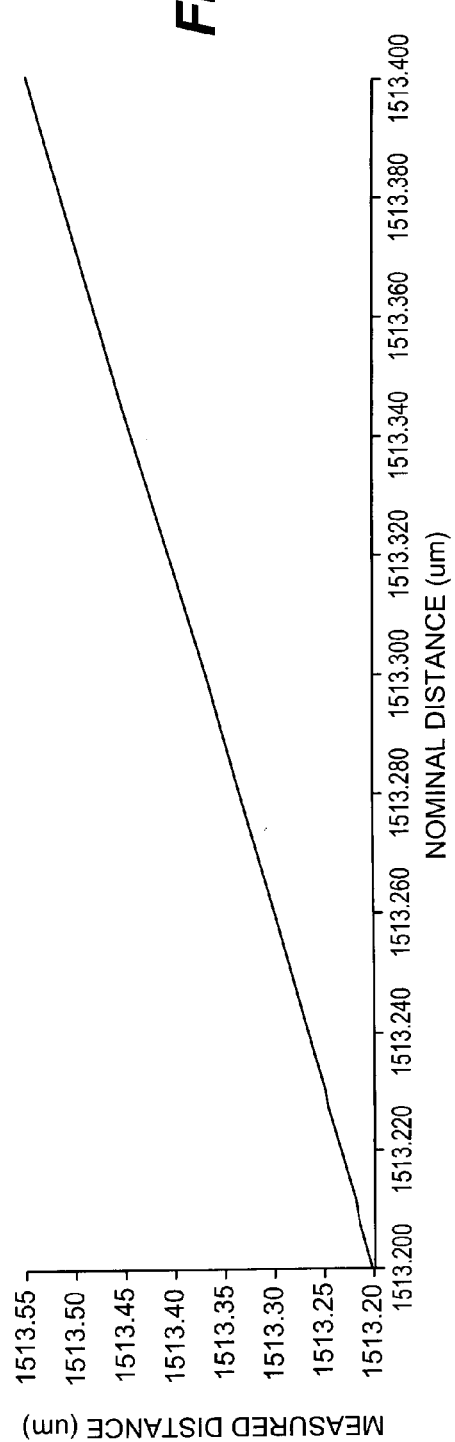
FIG. 7B shows the same data shown in FIG. 7A plotted as a function of actual total thickness of substrate plus coating.
Figure 7C:
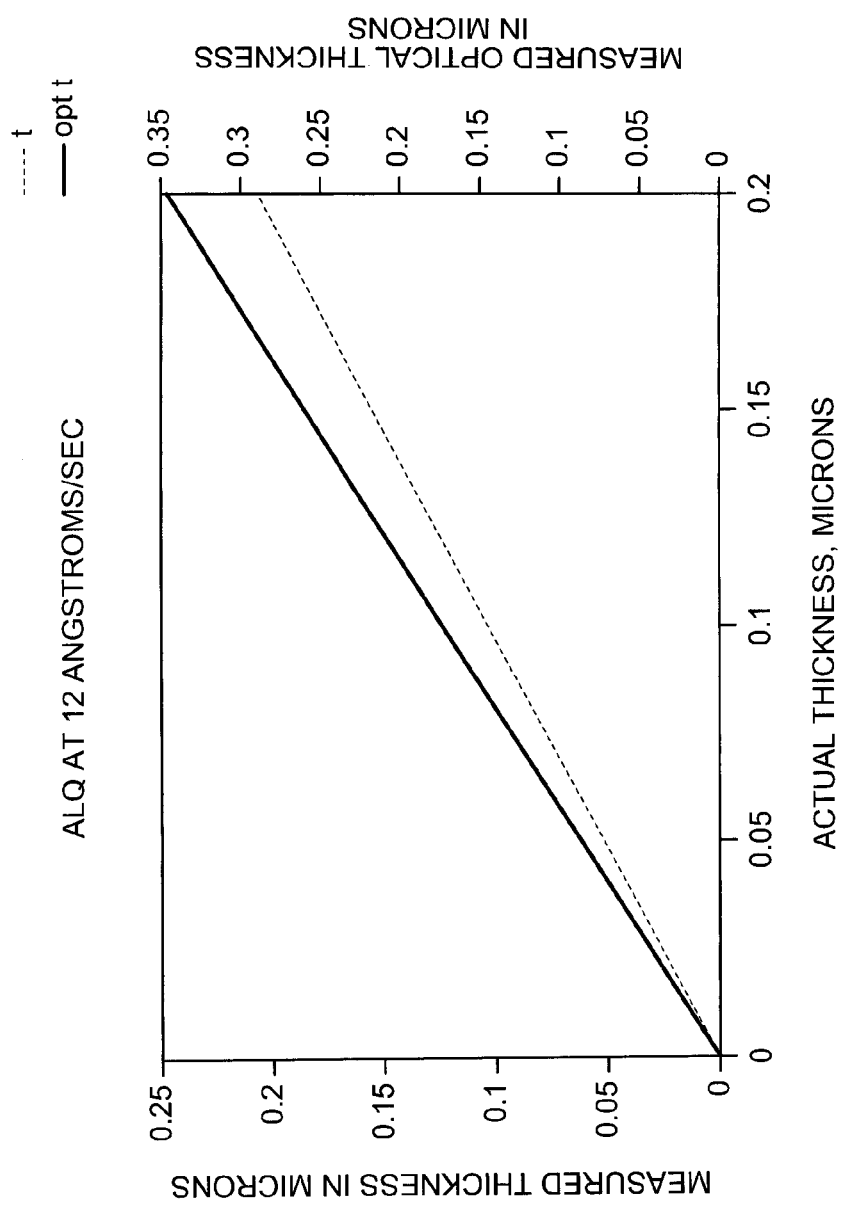
FIG. 7C shows the measured optical thickness and the measured thickness of the same coating shown in FIG. 7A as a function of actual thickness.

The optical thickness of the glass substrate was measured as 1513.201 µm before coating was initiated. The deposition rate was stabilized at 12 Å/sec using the quartz crystal monitor before the shutter was opened. FIG. 7A shows the measured optical thickness of the substrate plus coating as a function of time after the shutter was opened. FIG. 7B shows the same data shown in FIG. 7A plotted as a function of actual total thickness of substrate+coating based on the 12 Å/sec deposition rate. FIG. 7C shows the measured plus optical thickness on the second axis (right) and the thickness on the first axis (left) as a function of actual thickness for this experiment.

Figure 7D:
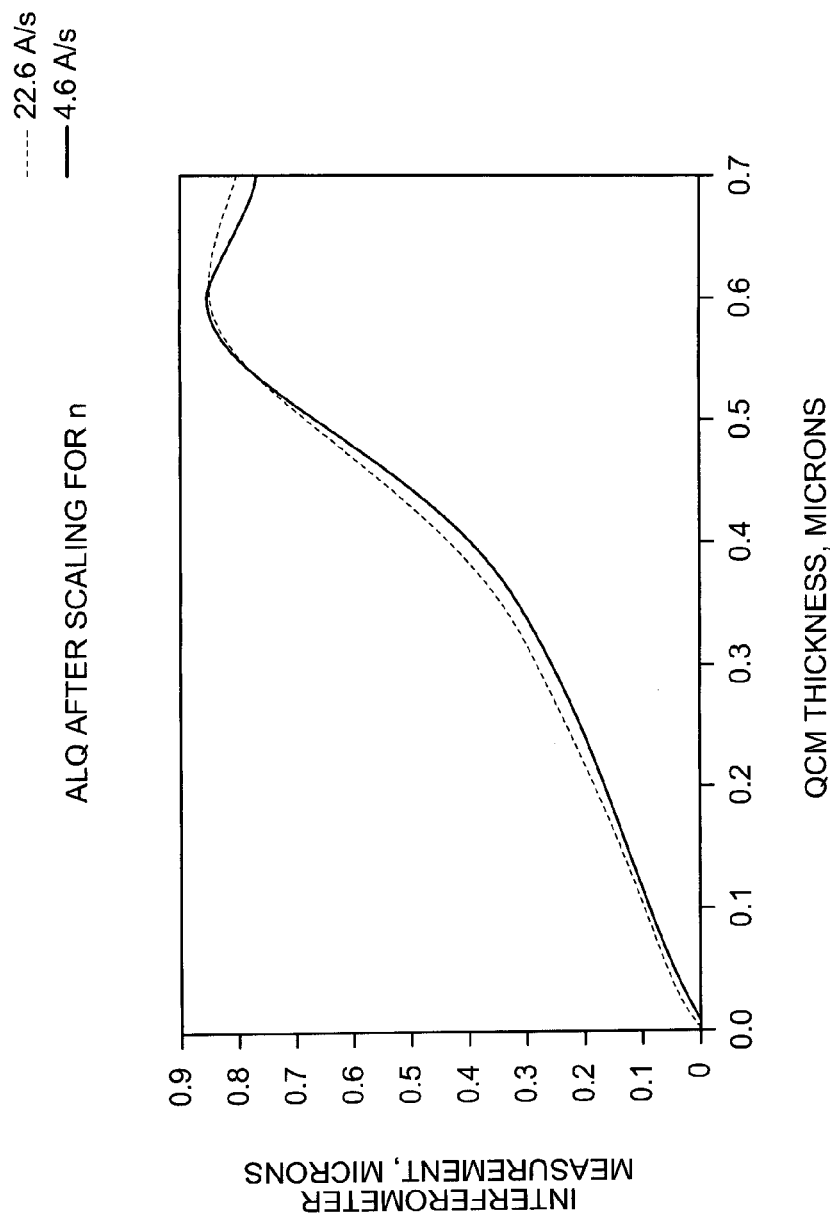
FIG. 7D shows interferometer measured data for thickness of an ALQ coating on a glass substrate coated at different rates of 4.6 Å/sec and 22.6 Å/sec.
Figure 7E:
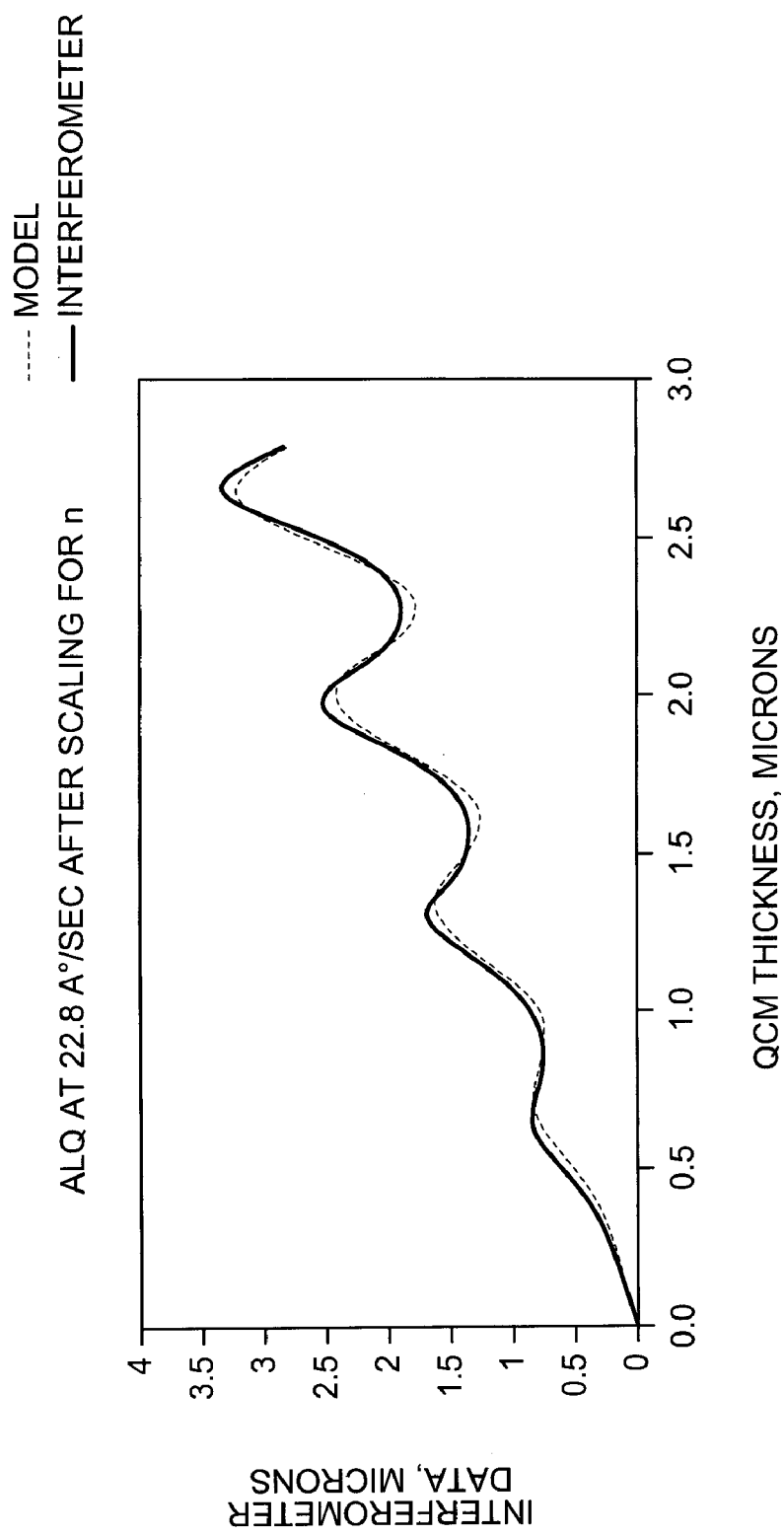
FIG. 7E shows interferometer thickness data for an ALQ deposition at 22.8 Å/sec that was continued up to a total coating thickness of 2.7 μm.

FIG. 7D shows interferometer data for thickness of an ALQ coating on a glass substrate coated at different rates of 4.6 Å/sec (0.46 nm/sec) and 22.6 Å/sec (2.26 nm/sec) as measured with a quartz crystal monitor. The deposition rates varied by about 5% during the deposition accounting for the minor differences in the data. Note that the measured thickness goes non-linear above about 0.3 µm (3000 Angstroms) and actually starts decreasing as the actual coating thickness continues to grow in excess of 0.6 µm in thickness. This phenomenon occurs due to thin film interference effects which is of the form $$(n_3 t_3)_{meas} = n_3 t_3 - A\left(\frac{(n_3 - n_2)^2}{(n_3 + n_2)^2}\right)\cos\left(\frac{4\pi n_3 t_3}{\lambda} + \phi\right) \quad (17)$$

where A is an amplitude term and $\phi$ is a phase angle. FIG. 7E shows interferometer thickness data for an ALQ deposition at 22.8 Å/sec (2.28 nm/sec) that was continued up to a total coating thickness of 2.7 µm. The model calculation using equation (17) is also shown with the data. The variation between model and measured data is well within the coating rate uniformity of + or −5%.

Figure 8:
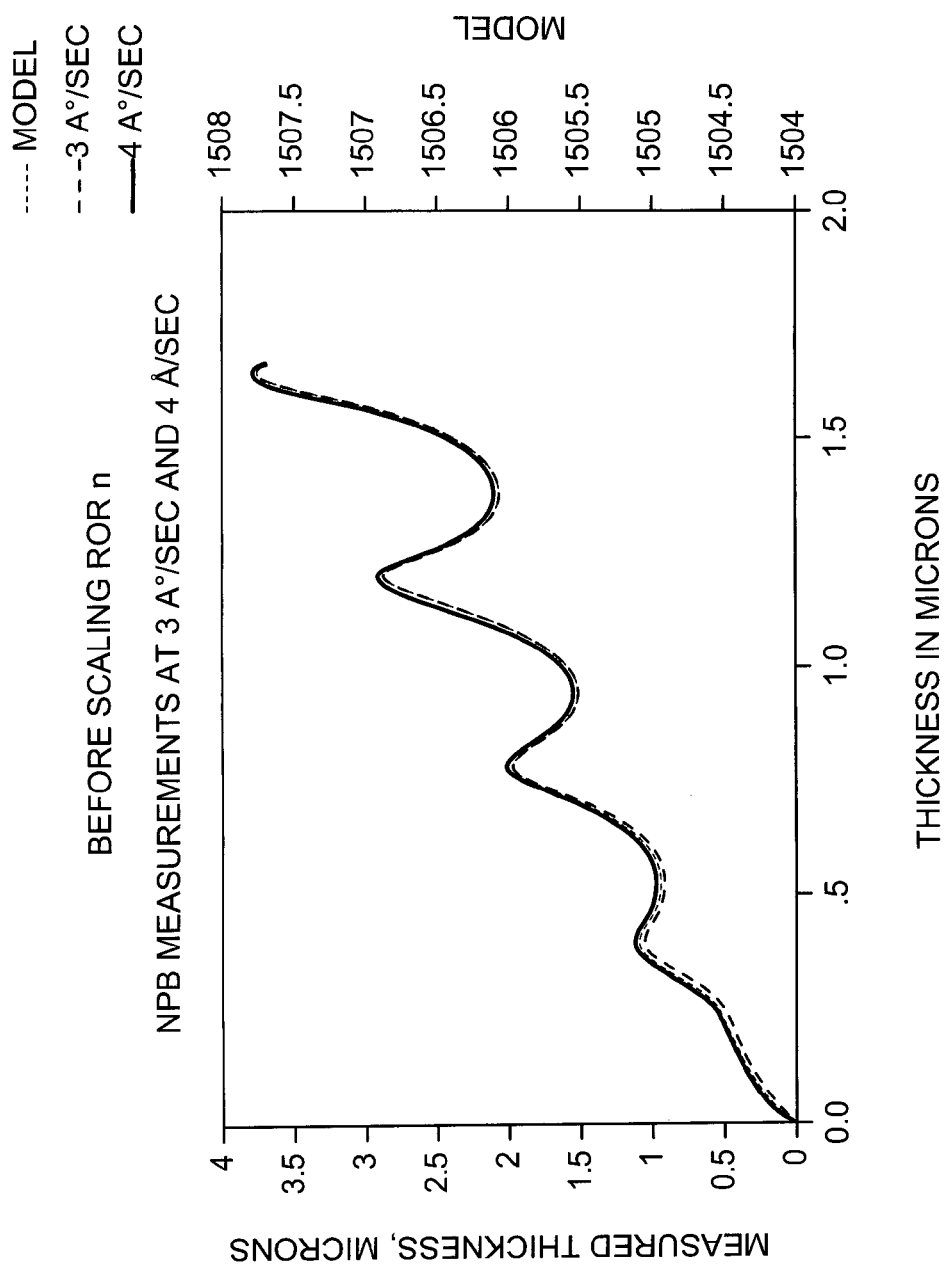
FIG. 8 shows interferometer measured data during NPB deposition during deposition at rates of 3 and 4 Å/sec along with model data.

FIG. 8 shows interferometer data for NPB obtained at deposition rates of 3 Å/sec and 4 Å/sec. (0.3 and 0.4 nm/sec.) along with the model calculation using equation (17). For this experiment the glass substrate had an index of refraction of 1.468 and the NPB group index of refraction at 1300 nm was determined to be 1.735.

Figure 9:
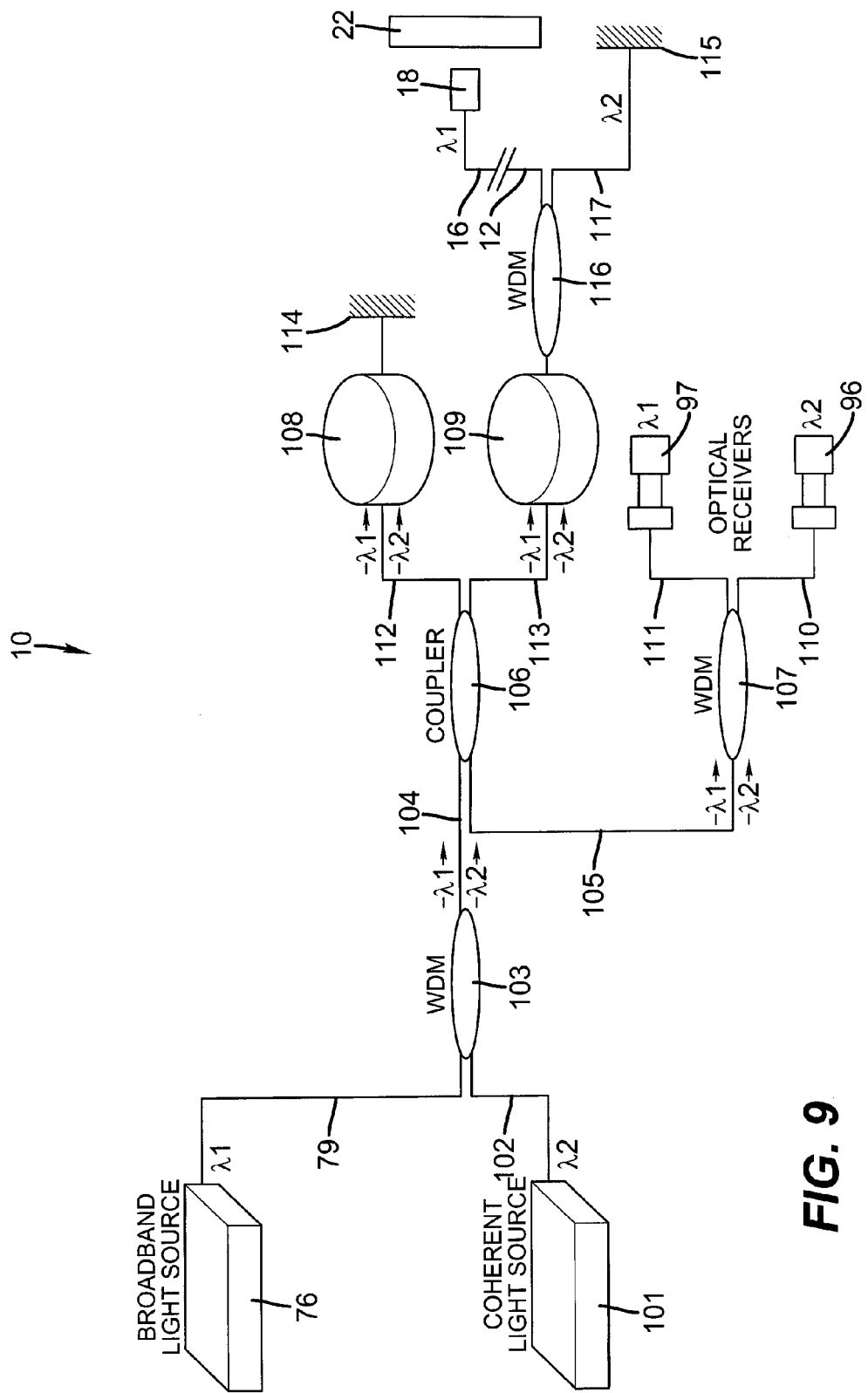
FIG. 9 shows an alternate configuration for the interferometer used in the practice of this invention.

An alternate configuration for an all fiber based interferometer is shown in FIG. 9. Instead of being an autocorrelation based instrument as shown in FIGS. 4 and 5 this configuration is a standard Michelson configuration in which the sample is placed in one of the arms of the interferometer. A reference laser is included to provide constant distance interval sampling as described above. All parts serve the same function as in the description for FIG. 4 above with the exception of an addition of a reference WDM 116 which is used to separate the coherent source signal from the sample low coherence signal. The coherence source signal is made to travel down a reference optical fiber 117 and is incident on stationary mirror 115. In order for the interferometer to function, the pathlengths of travel to the mirrors and sample 22 to the right of coupler 106 must be the same within the pathlength excursion of the interferometer.

In order to extend the deposition monitoring rate measurement range beyond a thickness of a few thousand Angstroms it is desirable to add a broadband light source at a second wavelength and a detector for the interfering light at this wavelength. These components can readily be integrated into the instrument designs shown in FIGS. 4, 5 and 9.

Thickness Measurement Using Fluorescence

A way to use fluorescence has been designed that does not require the sample to move, but collects the signal in real time. In this way, the actual coating of the layer of interest is measured during deposition and real-time deposition monitoring for deposition rate, thickness, and composition can be accomplished. This method requires that the substrate where measurement is taken be transparent, but this can be accomplished for many types of substrate by the correct choice of wavelength. In addition, this technique allows straightforward use of a witness plate, requiring only that some portion of the substrate be transparent, but not necessarily the substrate at the deposited useful layer. Third, because the fluorescence is measured through the substrate itself, the supporting optics are protected by the coating piece itself and no additional barriers or baffles need to be used. Also, the probe can be designed to provide additional protection without complicated baffles. The probe or substrate do not need to be moved away from the coating area to take a measurement. In this way, the measurement can be obtained during coating, in real time, without stopping the coating process. The optics needed can be small enough to provide a probe that can fit into many coating geometries. Excitation light for fluorescence can be of the same wavelength as the illumination for interferometric measurement.

Figure 11:
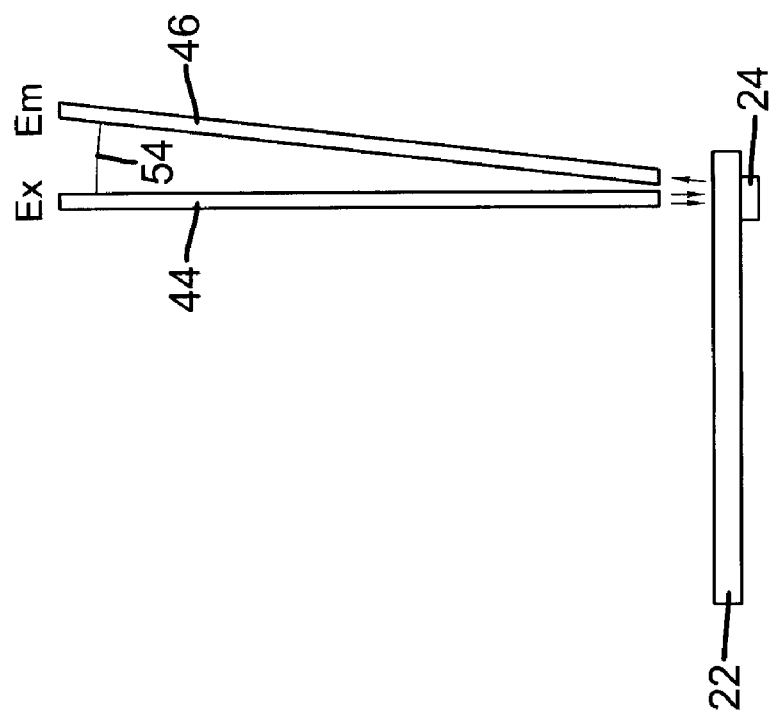
FIG. 11 shows components of the measurement system of FIG. 2.

In one embodiment shown in FIG. 11, the probe is designed with an excitation fiber 44 that carries the excitation light to the substrate 22 and coating layers 24. There is also a collection fiber 46, typically positioned at an angle 54 relative to excitation fiber 44 that collects the emitted light from the coating layers. Collection fiber 46 can be coincident with, or at the same angle of the excitation fiber. However, this requires that the excitation light be blocked or filtered from the fluorescent light traveling through collection fiber 46 to the detector. This can be accomplished through the use of a notch filter or, since luminescence is shifted to longer wavelengths than the excitation light, by the use of a short wavelength blocking filter, also known as a long wavelength passing filter. If the angle of collection fiber 46 is increased to a more off-axis position, increasing the angle between collection fiber 46 and the angle of excitation fiber 44, less of the scattered excitation light will then be collected. This is because the excitation light that is scattered is mainly due to specular reflectance from the interfaces in the sample, and reflects from the normal to the sample surface at an angle corresponding to the incident angle of excitation fiber 44 to the normal of sample 22. For example, if excitation fiber 44 makes an angle of 0 degrees to the normal of the surface of sample 22 (that is, excitation fiber 44 is perpendicular, or normal, to the surface of sample 22), then the specular reflectance is normal to the surface of sample 22. As collection fiber 46 varies from this normal axis at angles increasingly greater than 0 degrees from excitation fiber 44, less of this specularly reflected light will be collected. However, the fluorescence of any excited molecules is emitted over 360 degrees from a random sample, which is typical for sample layers that are coated from organic vapor deposition. So, as collection fiber 46 is moved off-axis, emitted light will still be collected. However, there is also the effect of the interface on the emitted photons, which imparts a cosine squared dependence to the emitted light that is internally scattered out of the coating layer. Given these observations, it has been determined that with excitation light directed to the normal of the sample, the excited fluorescent light can be collected at some angle from 0 to 90 degrees off-axis to this normal, with the optimum elimination of scattered light and optimum collection of emitted light obtained at between 5 and 50 degrees, preferably between 20 and 25 degrees. Therefore, probes have been designed with 2 fibers, with an angle of approximately 22 degrees between the 2 fibers.

The spectra from thin coatings on a substrate in vacuum (or air) have a non-linear response with thickness, related to the interference of standing waves created by a stack of materials having different refractive indices. Although we have collected data related to thickness and composition without correction for this phenomenon, there are methods we have used to reduce the contribution of what can be called this "interference effect". For example, use of a roughened substrate or a diffuser on the fibers or placed directly above the substrate causes the incident light to come in at different angles, or to be collected at different angles, thereby disrupting the standing waves that otherwise result. We have also angled the two fibers as a unit relative to the normal to the surface of the substrate (as opposed to changing the angle between the fibers).

Figure 12:
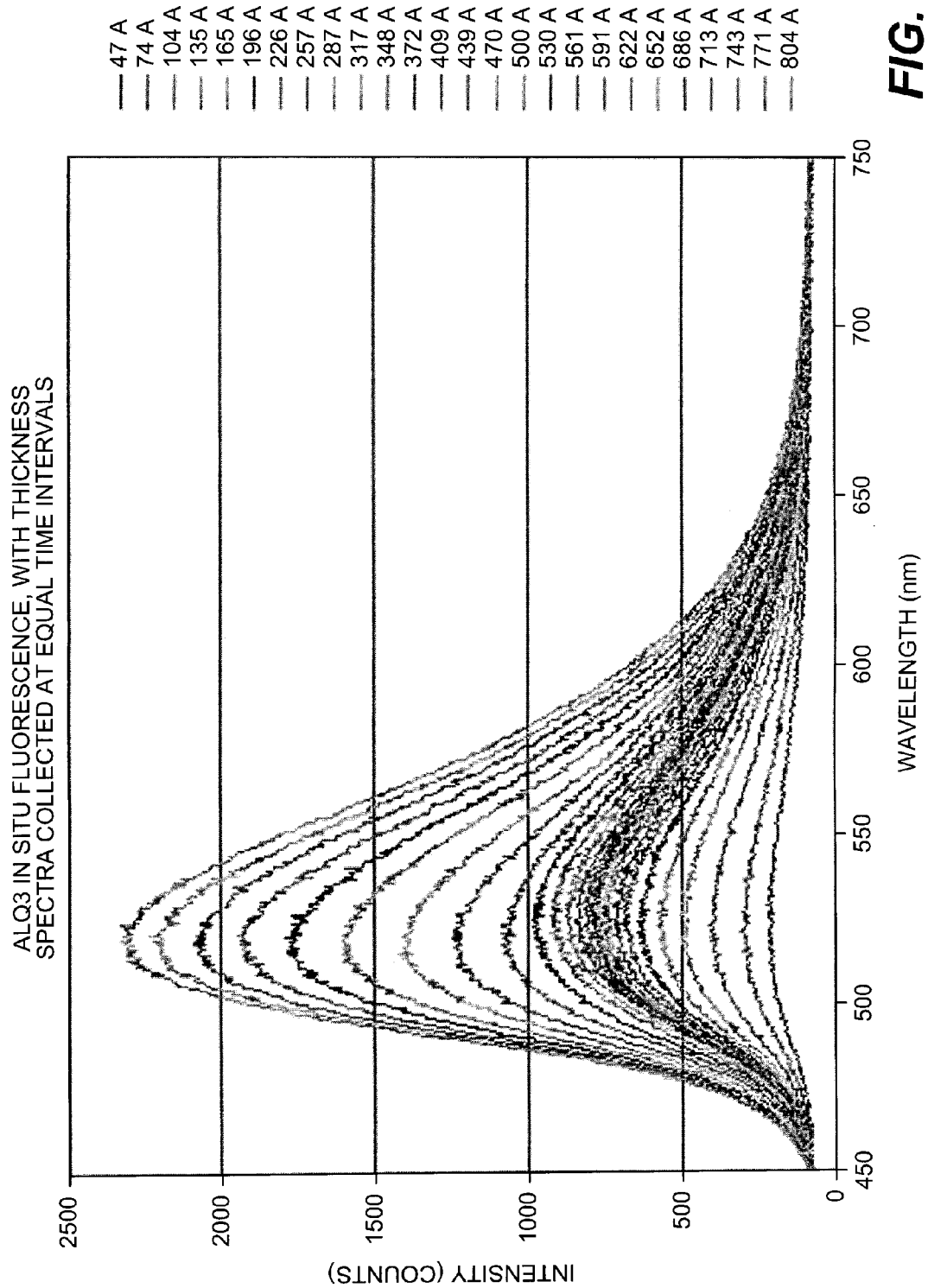
FIG. 12 shows a series of Alq3 luminescence spectra obtained as it is being deposited from 47 Å up to 804 Å.

To better illustrate the interference effect, FIG. 12 plots a series of luminescence spectra obtained from a coating of Alq3 as it is being deposited, from thickness of 47 Å to 804 Å (4.7-80.4 nm), as collected through a two-fiber probe. It is instructive to observe that the Rayleigh scattered light at the excitation wavelength has been blocked and baseline-subtracted. This was accomplished using a holographic notch filters from Kaiser Optical at the wavelength of the laser, in this case at 442 nm, as explained earlier.

The lowest spectrum in FIG. 12 is taken at about 47 Å (4.7 nm) thickness, as calibrated by a quartz crystal monitor (QCM). This QCM is at the same height as the probe and is about 3-4" away from the orifice that allows the plume to deposit on the witness plate. The tooling factor is about 80%. The 47 Å (4.7 nm) spectrum is well resolved, with good signal and low noise, indicating that the fluorescence system has detection sensitivity for fluorescence from coatings as thin as a few Å (a few tenths of nm).

It is also instructive to note that the wavelength of maximum fluorescence intensity, or lambda max, changes as a function of thickness. This is probably due to two effects. First, with very thin coatings, it is unlikely that there is a homogeneous film. For example, at thicknesses of a few Å(where 1 Å=0.1 nm), we do not typically have a monolayer of material. Also, it is likely that the sticking coefficient for a clean glass is different from that of glass with some Alq3 on it, so that "islands" of Alq3 will probably form, and then merge as the thickness increases. However, there is a second factor that affects the lambda maximum, namely, the interference effect. The glass/organic film/air stack of layers form a system of different refractive indices that can interact with the exciting light and the emitted light, resulting in some constructive and destructive interference effects. This has been observed in studies of light propagation in multilayer OLED devices. Also, although the spectra plotted are taken at equal intervals in time, the intensity does not increase monotonically.

Figure 13:
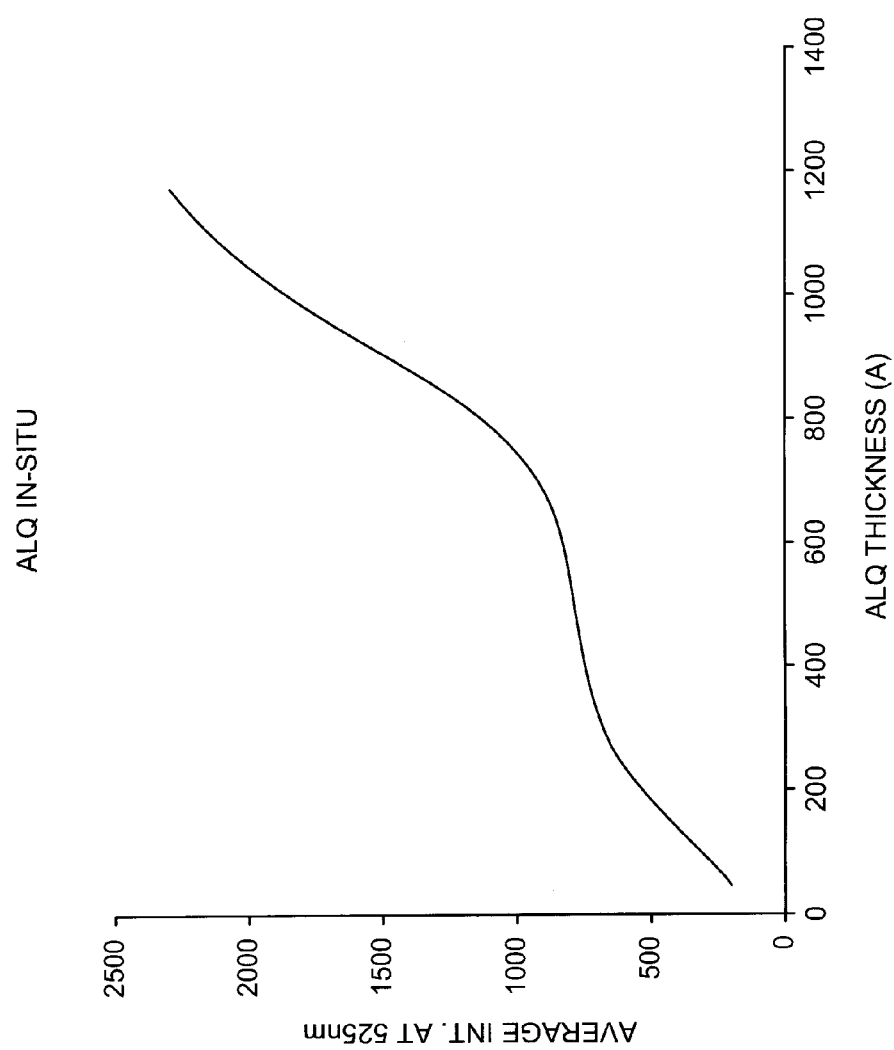
FIG. 13 shows the fluorescence intensity as a function of thickness for the spectra shown in FIG. 12.
Figure 14:
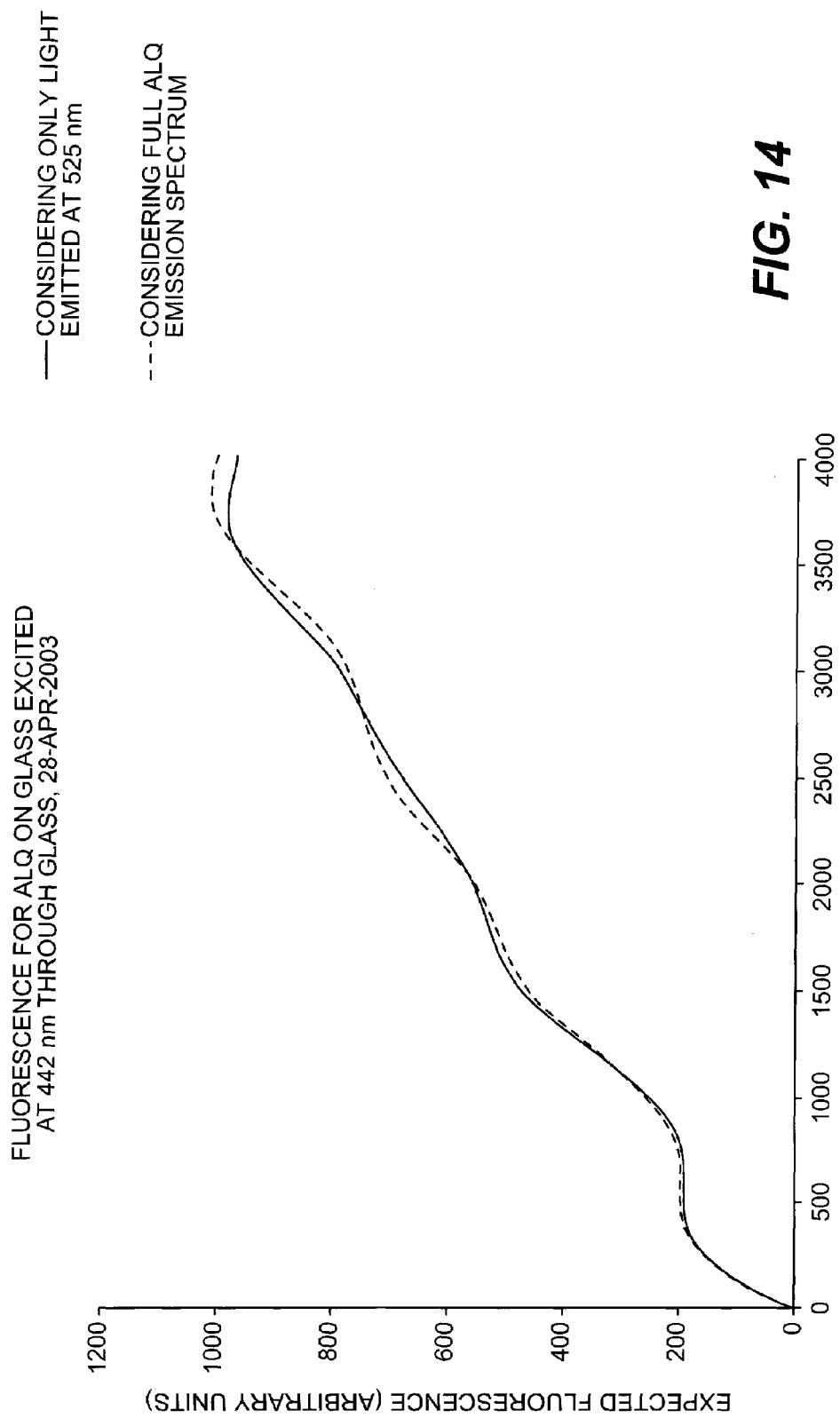
FIG. 14 shows the predicted curve for the data obtained in FIG. 12 and FIG. using an optical model that incorporates the refractive indices of all the layers and their respective thickness.

This becomes clearer in the graph of FIG. 13, which plots the emission intensity as a function of layer thickness. There are linear regions, followed by "plateau" regions, which are indicative of the interference effect. In the graph of FIG. 14, the curve predicted for this layer stack is shown, based on an optical model that incorporates the refractive indices of all the deposited layers and their respective thicknesses. This curve has the same shape, with an initial plateau region at a few hundred Angstroms, and additional plateaus as the thickness of the organic layer increases, although these plateaus become less pronounced with increased thickness. Of course, an experimental film may not be perfect (as stated above, it may not be homogeneous), and may have some roughness to it, so that exact match to a model would not be expected. Additionally, the curve changes shape slightly depending on how much of the light is collected: namely, on the spectral width of the light collected by the detector.

Figure 15:
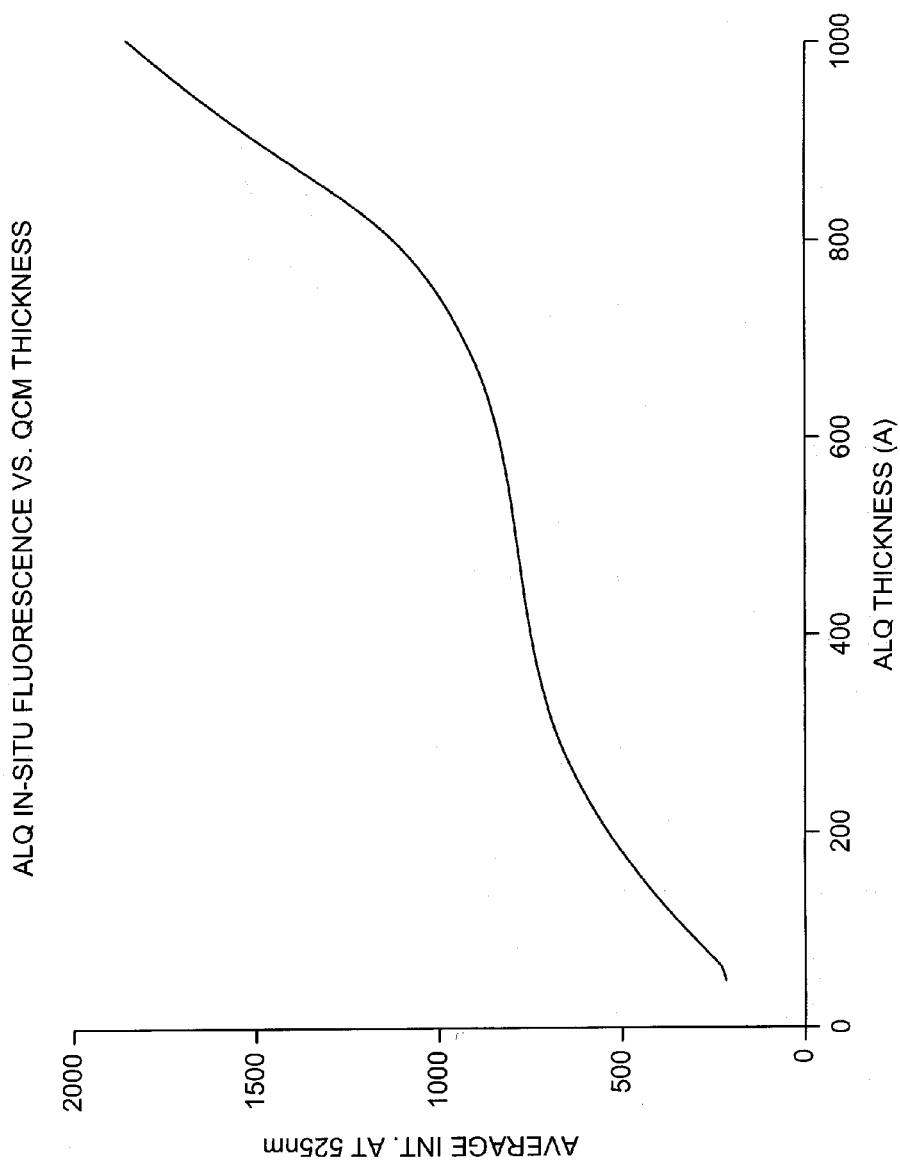
FIG. 15 shows a second experiment of deposition monitoring of Alq3 using fluorescence intensity.
Figure 16:
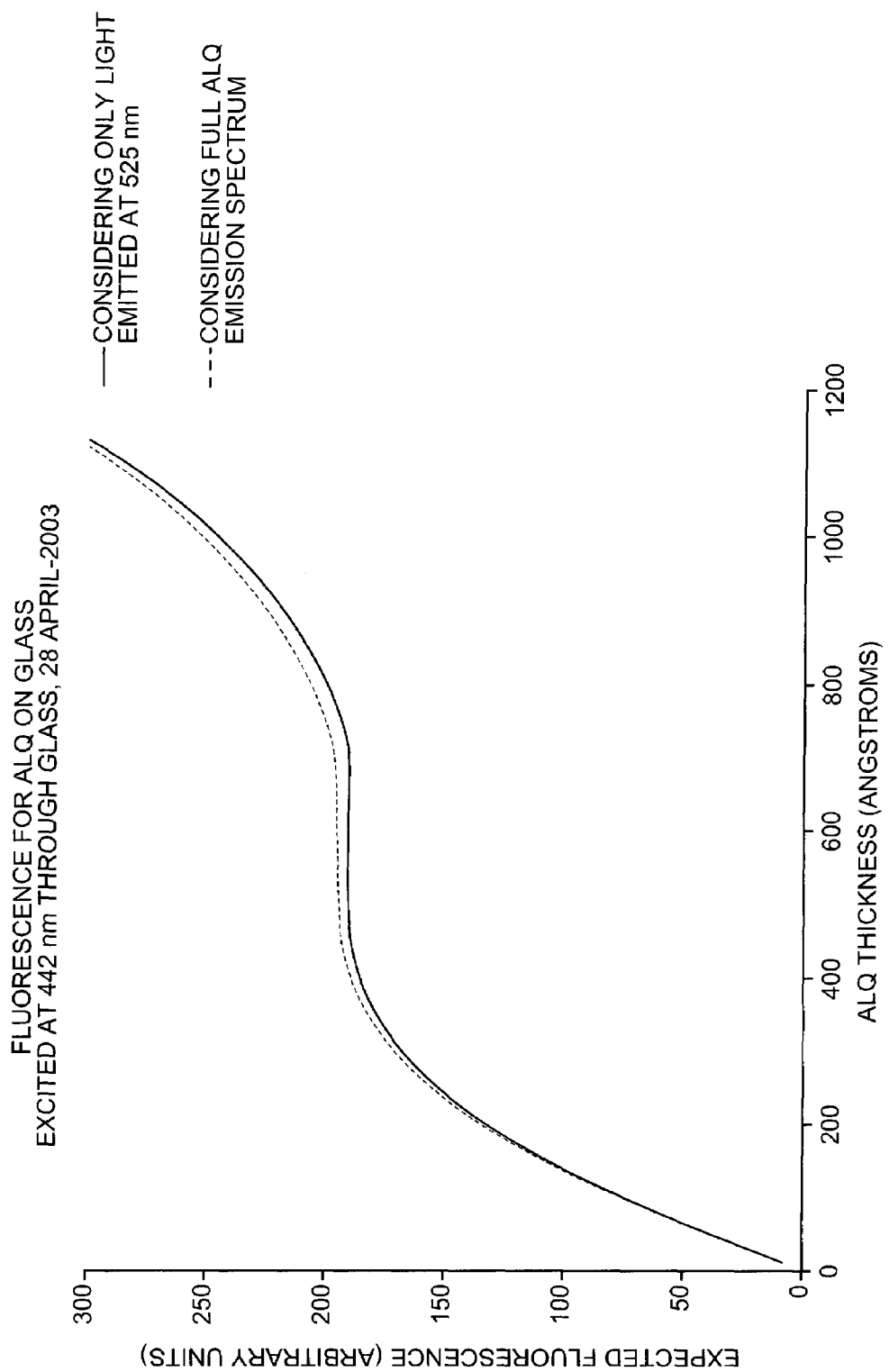
FIG. 16 shows a model for the data shown in FIG. 15.

It can be noted, however, that the match between the calculated intensity pattern and the actual collected intensity pattern is close, and can be observed under different coating conditions at different rates, so this intensity vs. thickness behavior is due to the interference effect. To illustrate this further, an expanded view of another set of measurements is shown in the graph of FIG. 15, with the same region modeled and presented as a calculated plot in FIG. 16.

The optical model also predicts some changes in lambda max, so these can also be interpreted as arising from the interference effect. To correctly measure thickness in coated layers, these interference effects need to be considered, calculated, compensated for, minimized, or removed.

Figure 17:
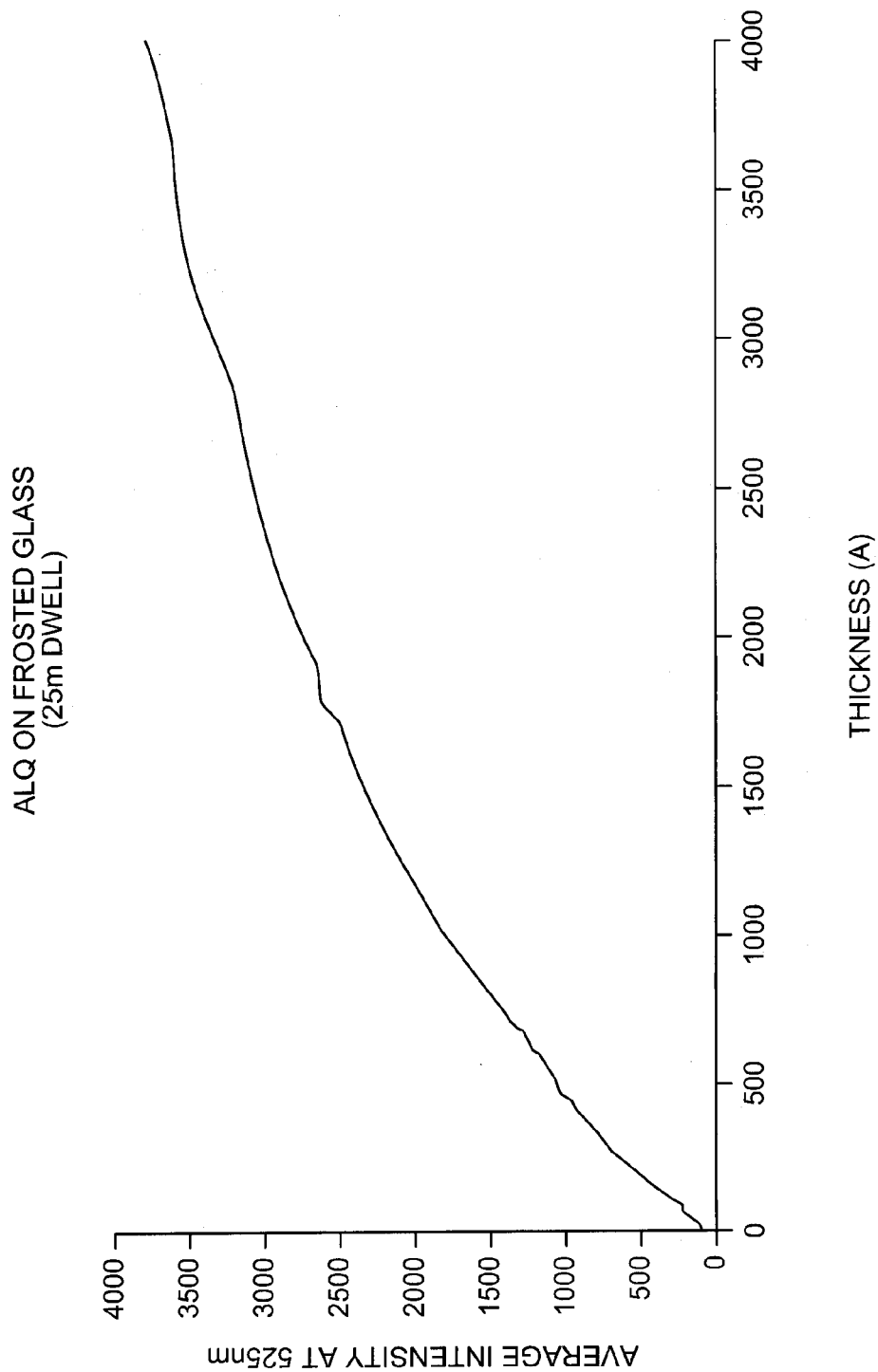
FIG. 17 shows the intensity of emitted light with increasing thickness of the coated layer in which the substrate has been roughened on the coated side prior to coating.

Changes can be made to limit the effect of constructive and destructive interference, and thereby minimize or remove the interference effecting in a system. One change is to make certain that the light cannot set up a standing wave in the stack and reduce or eliminate constructive or destructive interference. One way to do this is to roughen the stack of layers to make the reflected light bounce out of the stack, rather than back and forth within the stack of layers. The graph of FIG. 17 shows a more linear response of intensity of emitted light, with increasing thickness of the coated layer from a stack in which the substrate has been roughened. There remains a general downward curvature with increasing thickness. This is likely due to self-absorption, in which the light emitted by a component molecule is absorbed by surrounding molecules: as the layer thickness increases, there are more molecules to absorb the light before it can escape or be collected by the collection fiber. Therefore, the emitted energy is reabsorbed. At some thickness, the emitted light intensity will not increase. After that point, the emitted light that reaches the collection fiber only comes from the back surface of the layer, and is independent of thickness. This occurs as we approach 4000 Å (400 nm) for many organics deposited by organic vapor deposition.

Figure 18:
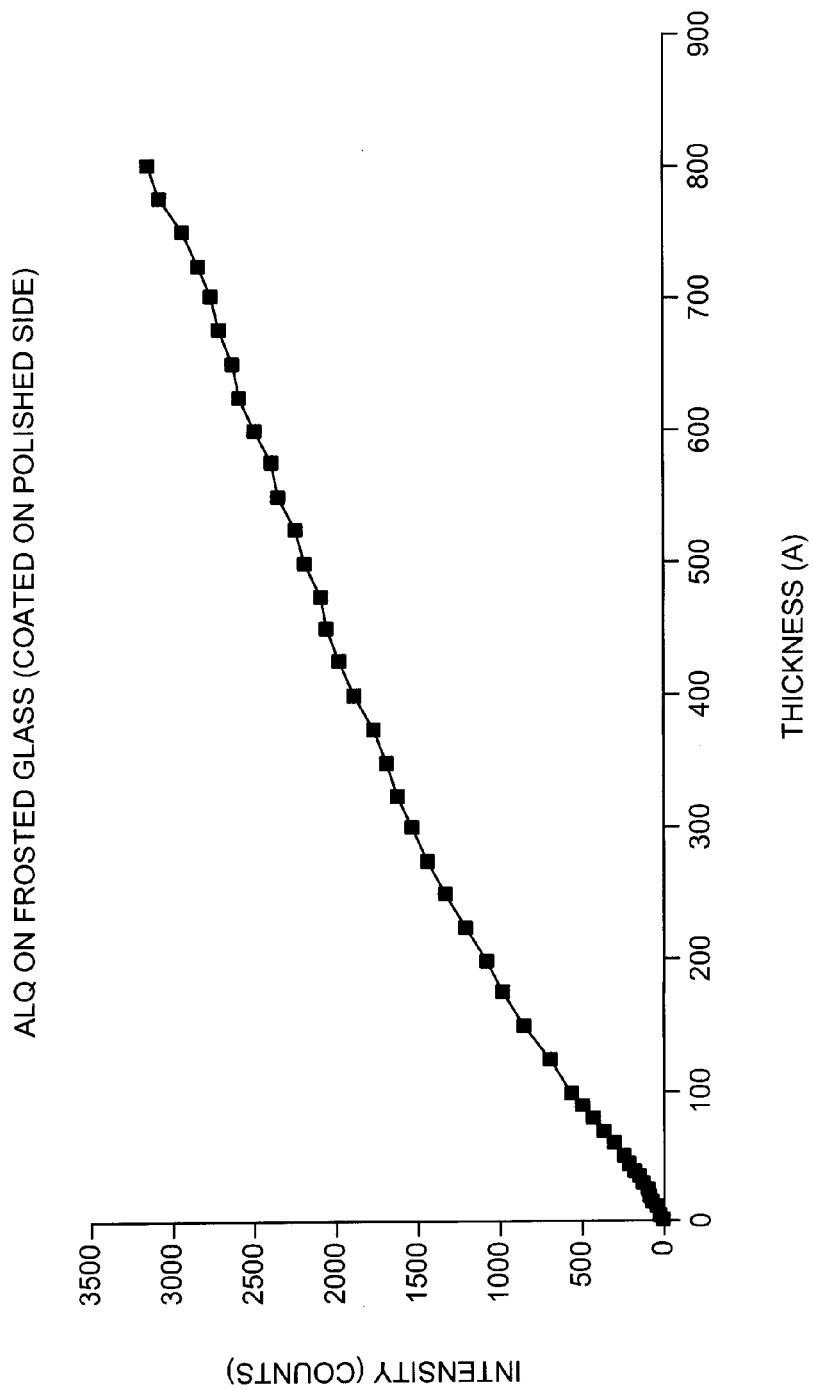
FIG. 18 shows the intensity of emitted light with increasing thickness of the coated layer in which the substrate has been roughened on the uncoated side prior to coating.

The minimization of the interference effect using a roughened surface can be accounted for by an optical model if the roughened surface is adjacent to one of the organic layers. Some models may have difficulty accounting for the minimization of the interference effect if the roughened surface is disposed on the substrate side that is not in contact with the coated layer. However, the graph of FIG. 18 shows a plot of intensity vs. thickness in which the interference effect is again minimized, but now by a substrate for which the roughened side is not the coated side. Some models may assume that excitation and emission collection is normal to the surface and that coatings are homogeneous; however, it has been found that there is probably some slight angle, and the coating is not homogeneous.

It has been observed that we can reduce and almost eliminate the interference effect by tilting the probe at some angle away from the normal to the substrate or sample surface. Tilting the sample is easier to accomplish than roughening or index matching. Although the interference effect is reduced by increasing the angle of tilt from the normal to the substrate surface, the tilt need not be very large to be effective. The intensity of the overall emitted light collected is also decreased by tilting the probe. Therefore, we have chosen angles between 5-30 degrees, preferably between 10-25 degrees, and we have optimized the angle to between 20-25 degrees from the normal to the substrate surface. These angles significantly reduce the non-linearity due to the interference effect, but maintain an acceptable collection of emitted light.

Finally, diffusing either or both the collection and excitation beams can reduce the interference effect. However, this is not as effective as the roughened substrate. The substrate is only a small distance (<1 mm in some cases) from the interface with the coating, so that roughening at this point causes a large deviation in the angle of the light that interacts with the coated layer and its emitting components. If the beam is diffused farther away from the layer, then that light which can both excite the component in the layer and also be collected is still approximately on axis and suffers more from the interference effect. Placing a diffusing layer directly above the substrate has also been found effective in reducing the interference effect. This is preferred to roughening the substrate in most cases especially when the substrate will be used in display applications.

It might be expected that directing excitation light and measuring at different angles would change the level of the interference effect. However, although this occurs, the intersection of the angle of exit of photons from the exciting fiber and the angle of acceptance of photons from the collecting fiber is what determines which photons are collected. In cases with normal silicon fibers, the numerical aperture of 0.22 allows only an angle of 22 degrees off-axis, so that, in the cones of acceptance, the light still demonstrates the interference effect to some degree.

Figure 19:
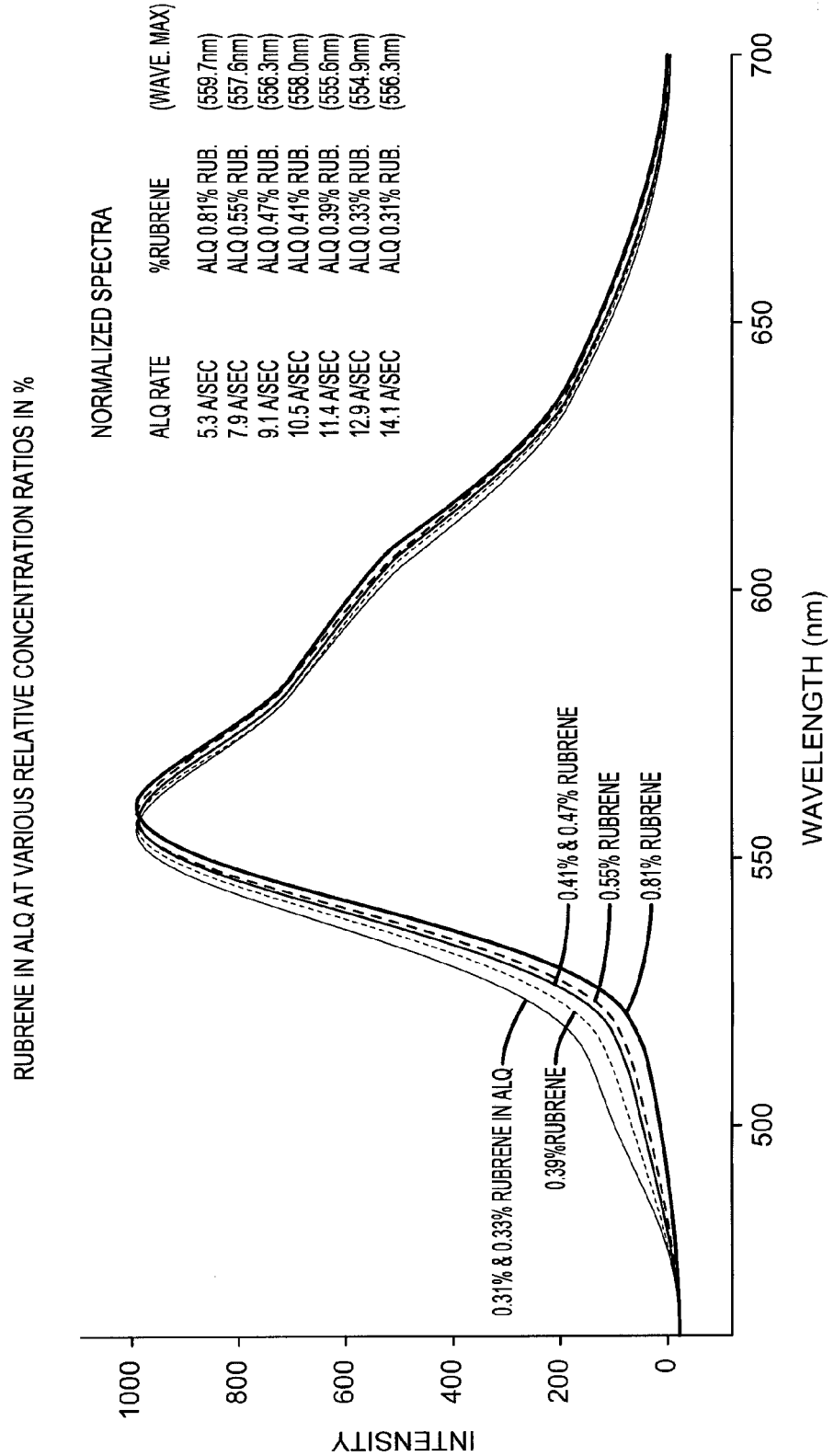
FIG. 19 demonstrates the use of in situ fluorescence for compositional information with two components, rubrene and Alq3.
Figure 20:
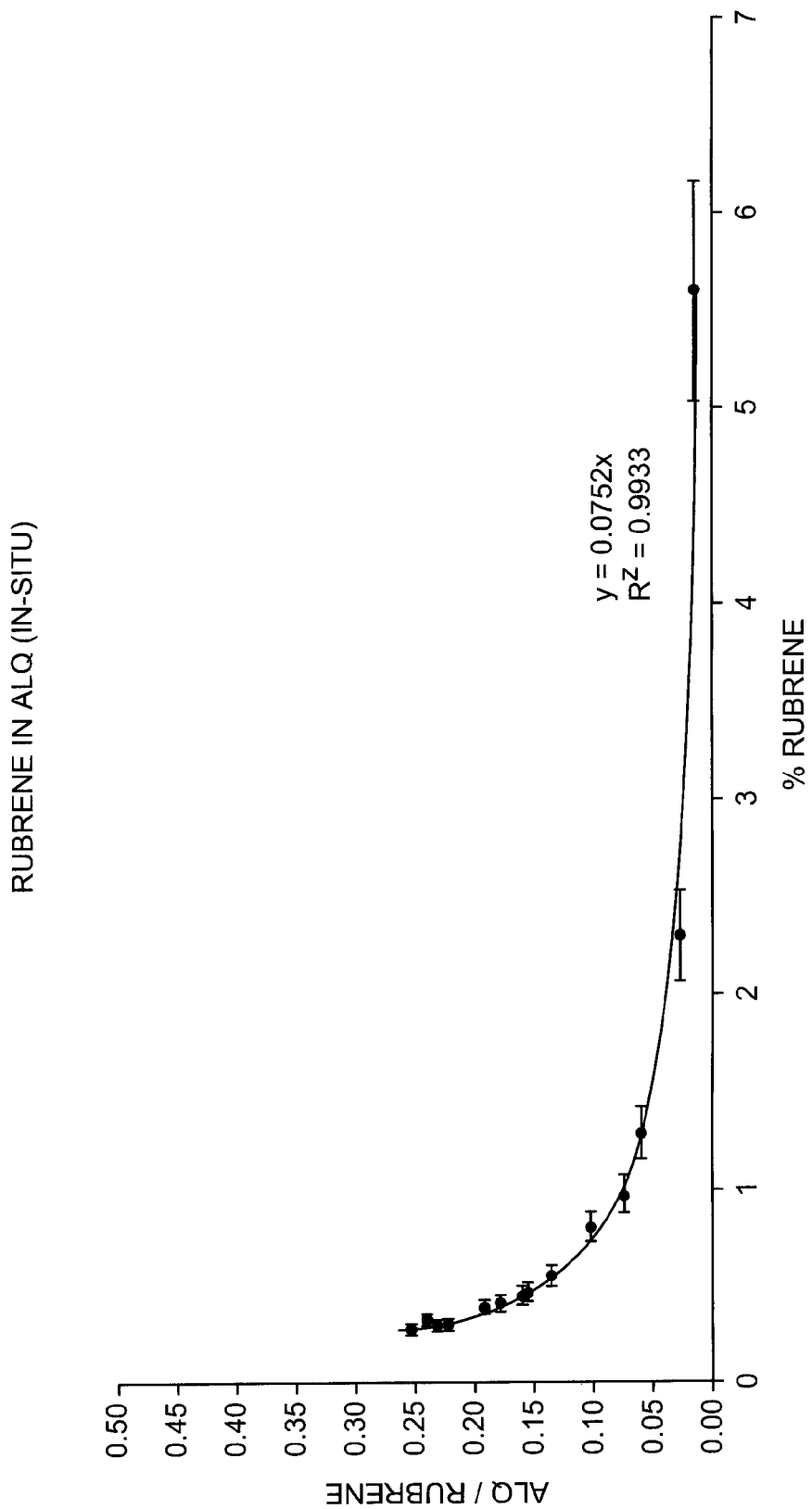
FIG. 20 shows the ratio of Alq emission intensity to rubrene emission intensity as a function of rubrene concentration.
Figure 21:
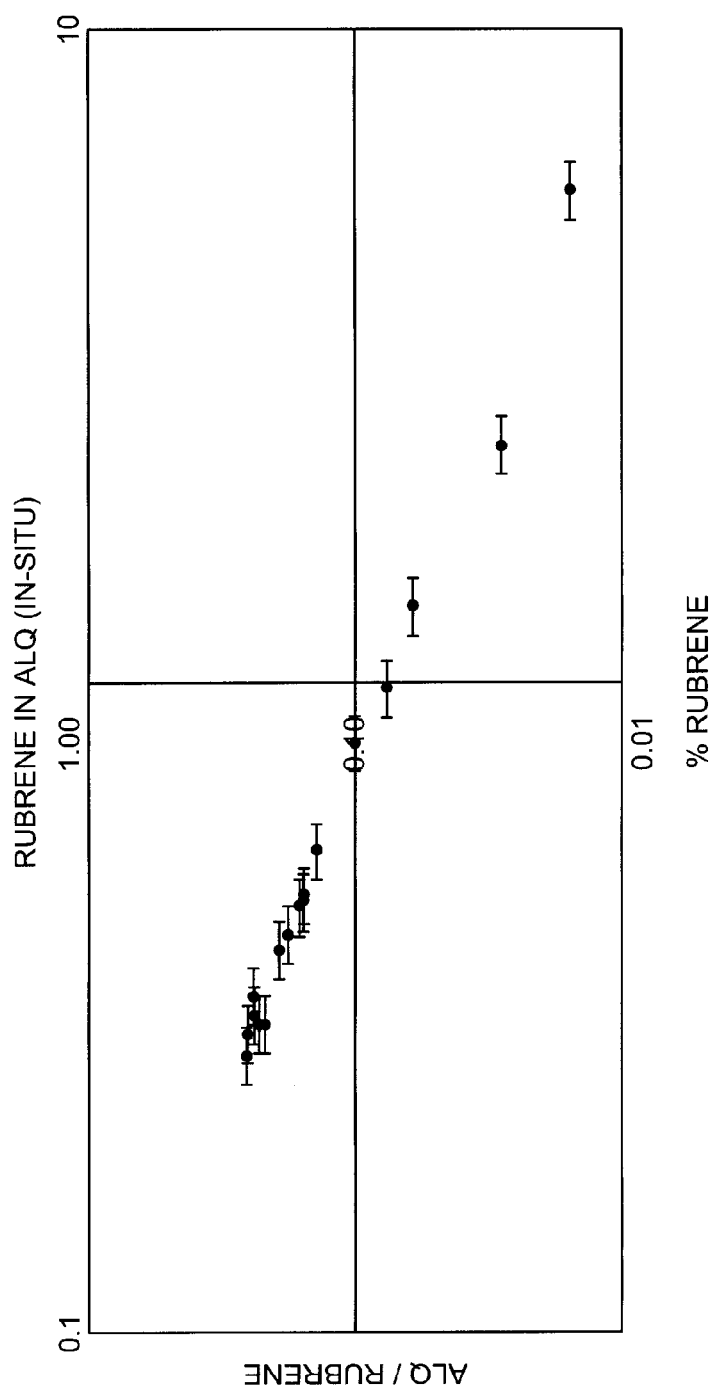
FIG. 21 shows a log/log plot of the data shown in FIG. 20.

The use of fluorescence in situ has been demonstrated for obtaining compositional information. For a substrate with two component coatings, rubrene and Alq3, applied simultaneously at varying rates of rubrene, the final composition of the coated layer varied in rubrene to Alq3 ratio from about 0.3% to 3%. As plotted in the graph of FIG. 19, it can be observed that the shape of the fluorescence emission spectrum changes with composition percentages. This is a result of energy transfer of collected photons by the host, Alq3, to the dopant, rubrene, so that the emitted photons are emitted by rubrene. As the amount of rubrene dopant increases, more of the emitted photons come from rubrene, and the spectrum begins to resemble that of rubrene, and less that of Alq3. The intensity of emission at the emission lambda max for rubrene becomes more prominent as the amount of rubrene is increased, and the intensity of emission at the emission lambda max for Alq3 decreases. In the range of lower concentration of rubrene or dopant, a ratio of two wavelengths, one whose intensity is predominantly contributed to by Alq3 and one whose intensity is predominantly contribute to by rubrene, provides a measure of the relative concentration ratio of Alq3 to rubrene. This is plotted as the ratio of Alq3 to rubrene as a function of rubrene concentration in the graph of FIG. 20. This can be plotted (as shown in the graph of FIG. 21) to be a linear relationship on a log/log plot. As the concentration of rubrene increases, the intensity of the rubrene predominates, and the shift in the rubrene band, or the intensity of the rubrene band to a selected reference band in the emission spectrum, can be used to measure the rubrene to Alq3 concentration ratio. Again in FIG. 19, results indicate that the emission maximum also somewhat correlates with the amount of rubrene, shifting to increasing wavelength as the amount of rubrene increases. However, it is clear that this relationship is not always linear or monotonic at all relative concentration ratios.

If one or more components of the layer emits, but other components of the layer do not emit, then it becomes necessary to know the overall thickness of the layer to determine the relative concentration ratio of the emitting components. To do this accurately and in real-time for the layer that is being coated, a measure of the thickness or rate of deposition using another method is also needed. One method is to use low coherence interferometry, as disclosed herein, to measure the thickness of the overall layer. Then, in a similar fashion to that described and illustrated previously, the ratio of intensity of the emitting component, at one of the wavelengths of emission, to the overall thickness, as determined by low coherence interferometry, is determined. Then, the ratio of the intensity of emitting components to each other or to the overall thickness yields the concentration ratio of all the emitting components to each other and to the sum of all the non-emitting components in the coated layer.

A fluorescence probe has been developed where the incident light and fluorescent beams are about 20-25 degrees apart and fluorescence intensity is collected during the coating event. The fluorescence is capable of measuring coating rate, and total coating thickness if the background fluorescence from the substrate is known. Relative concentration of host and dopant component materials can be determined by use of multiple wavelengths. For this type of determination, it is important that the emitted light for each component be distinct. That is, for each component, the wavelength or range of wavelengths emitted by that component can be clearly distinguished from the wavelength or range of wavelengths emitted from any other component material in the layer. This means, for example, that a component emits light over at least some portion of the spectrum that is unique to that component for the layer.

EXAMPLE #1

This example used a coating apparatus that operates at a pressure of about $1 \times 10^{-6}$ Torr. The main working components designed for the in situ measurements are shown in FIG. 10. A witness plate 120, or mother glass or substrate, is disposed behind a metal aperture plate 126 or shadow mask that allows the plume of evaporated material to deposit a sample 122 through aperture 124 onto a known area, which is about a 1 inch diameter spot in the case of the metal plate. In one embodiment, the optics on excitation and collection fiber optic cables 44, 46 are collimating lenses, which illuminate and collect the luminescence from a spot of ¼" radius. The excitation beam is collimated to ¼", and collection fiber 46 also has a lens on it to view a ¼" area overlapping with the excitation spot directed to sample 122. In one embodiment, collection fiber 46 is at approximately 22 degrees with respect to excitation fiber 44, and the plane containing collection and excitation fibers 44 and 46 is normal to the plane of the witness plate 120, substrate or mother glass.

In one embodiment, the substrate is about the size of a CD blank, but is made from transparent glass approximately 2 mm thick. This provides a rigid substrate. Deviation of the planarity of the optics across the plate is <<0.5 mm. The excitation beam is provided by a HeCd laser at 442 nm, which is used to excite Alq3 and any Alq3-doped composite films. The emitted light is directed by the collection fiber to a detector 42 such as an Ocean Optics fluorescence CCD spectrometer.

The Ocean Optics CCD spectrometer has a slit width determined by the core of the optical fiber, which is 600 um. This gives approximately a 4 nm resolution, as defined by Ocean Optics. The quality of the results is limited by the CCD, and can be improved by improving the CCD detector. Intensity results from thickness measurements and effects from coating on a roughened substrate are shown in the graph of FIG. 12.

Figure 2:
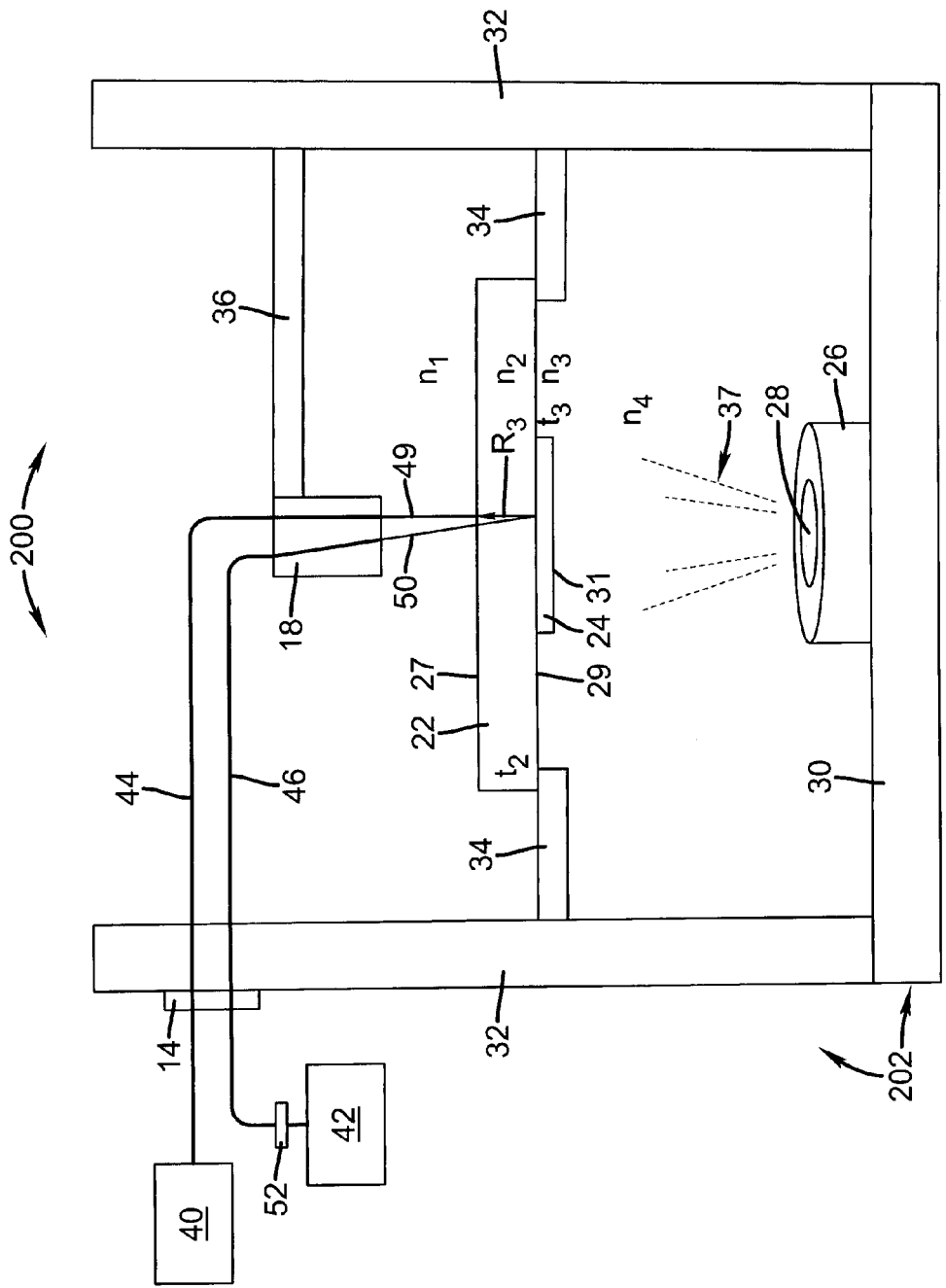
FIG. 2 shows an embodiment of a measurement system for performing in-situ fluorescence measurements of deposition thickness, deposition rates, and relative concentration of components on a substrate as it is being coated.

Another embodiment of measurement system 200 is shown in FIG. 2, which is similar to the embodiment shown in FIG. 1. In FIG. 2, however, low coherence light interferometer 10 has been removed. Additionally, there is an excitation light source 40 that is used to excite the emitting component in the coating layer 24 through an excitation optical fiber 44. Light source 40 can be a laser, as described above, for example, an HeCd laser exciting at 442 nm, or it could be some other type of light source, such as a xenon arc lamp, or a tungsten bulb. Any source of electromagnetic radiation that causes sufficient emission from the component in the layer can be used. Excitation fiber 44 that transmits the exciting light from excitation light source 40 can be a hard-clad silicon fiber, a soft polymer fiber, or any of a number of fiber materials. Single wavelength sources or sources that can be tuned or filtered to single wavelengths are useful because they excite less light in the fiber from other excitation wavelengths. Broadband light sources, such as an arc lamp or incandescent bulb can be filtered if a narrow band of exciting light is desired. A narrow band of exciting light provides Rayleigh scatter which is easier to block from detector 42 using an optional excitation source blocking filter 52 such as a notch filter or a spectrometer.

As shown in FIG. 2, the emitted light is typically collected at some angle from the excitation in optical probe 18, and returned to detector 42 through collection fiber 46. Detector 42 can be any suitable type of detector that is sensitive to the emitted light of interest from the component in the layer. A spectrometer can be used, in which a filter is used to allow only the emitted light and not the Rayleigh scattered exciting light to reach the detector.

Many types of spectrometers can be scanned to obtain fluorescence emission intensity at multiple wavelengths. Although only one wavelength may be needed in most cases to measure thickness or relative concentration ratio, many wavelengths can be collected and used to measure thickness or relative concentration ratio, as described earlier. Multiple wavelength spectrometers can have scanning monochromators, or may be constructed as spectrographs, as in the case of the Ocean Optics spectrometer used in Example 1, in which a grating is disposed to reflect the spatial filtered light onto a detector array, and the resultant signal is analyzed to provide emission intensity at a number of wavelengths simultaneously. The advantage of this configuration is that very small changes (that is, in the range of less than 1 Å or 0.1 nm) in the intensity can be measured in real time (effectively, within less than about 10 milliseconds) and therefore, the coating thickness and composition of the coated layer on the substrate can be determined.

Figure 3:
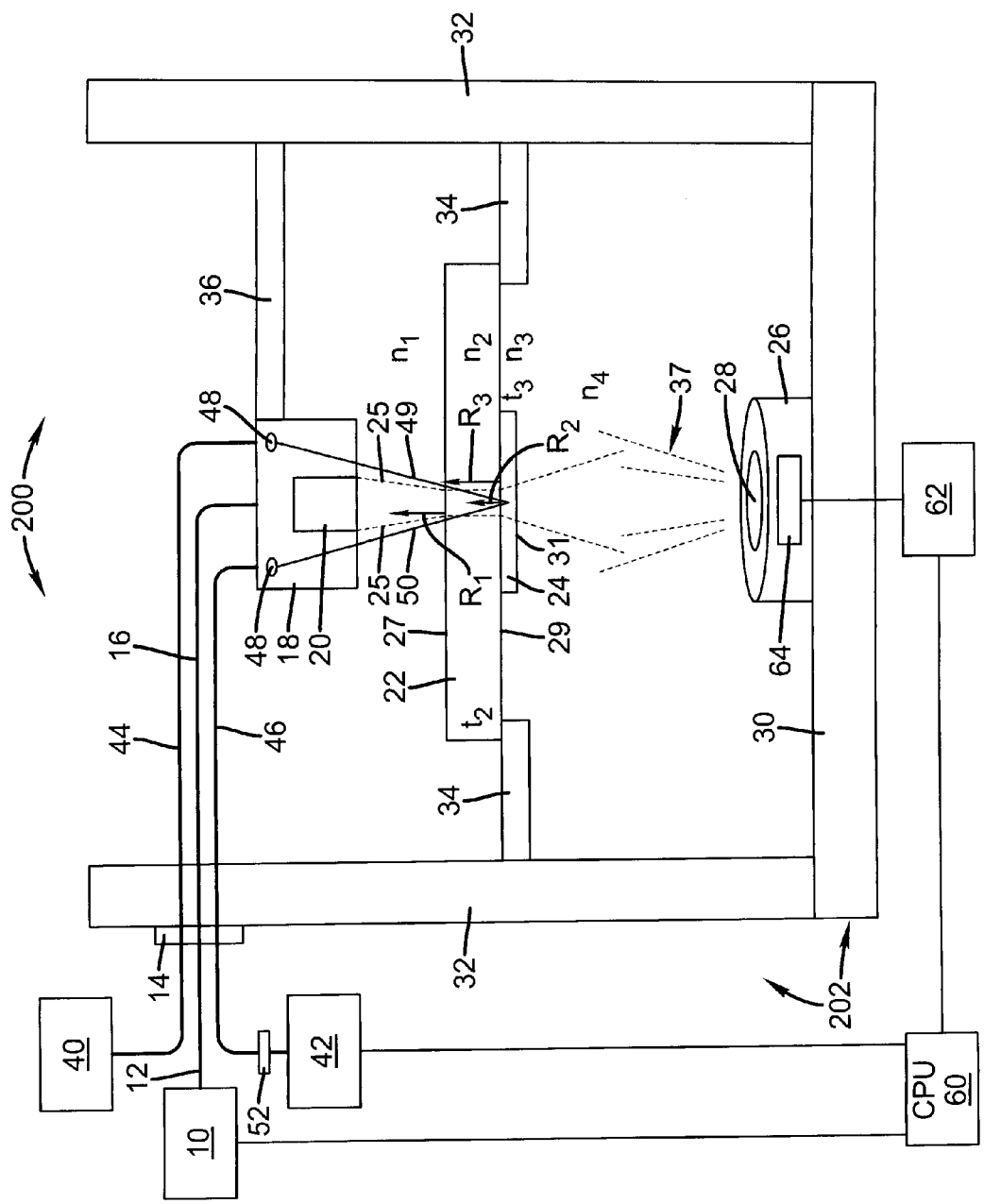
FIG. 3 shows an embodiment of a combined interferometric and fluorescence measurement system for performing in-situ fluorescence measurements of deposition thickness, deposition rates and relative concentration of components on a substrate as it is being coated.

Another embodiment of measurement system 200 is shown in FIG. 3, in which low coherence light interferometer 10, excitation light source 40, and detector 42 are now present, connected through optical fibers 12, 44, and 46. In this way, optical fibers 12, 44, and 46 can be brought to the sample through a single optical probe 18. The total thickness, as determined by interferometry, described herein, the thickness as determined by fluorescence, described herein, and the relative concentration ratio of emitting species can be measured simultaneously in this fashion. Measurement of the total thickness by interferometry at the same spot and at the same time as the measurement of the emitting light intensity with wavelength provides an advantage in that the interferometrically measured thickness can be used to calculate the relative concentration ratio in a layer, even if the layer contains some non-emitting components.

In FIG. 3, there are lenses 48 that are used to collimate the light. This may not be necessary for operation, but can be used to allow the light to pass through a longer probe 18. Also, by these means, the region that is measured can be defined by the intersection of the two collimated light beams, indicated by the solid lines that intersect at coating layer 24.

FIG. 3 also shows a control loop that employs the data on measured thickness and, where available, the data on relative ratio for component materials, in order to provide a measure of control of the deposition rate provided within vacuum chamber 202. A control logic processor 60 obtains the measured data from interferometer 10 and, optionally, from detector 42, and uses this measured data as feedback for controlling the vaporization rate. In the embodiment shown in FIG. 3, a heater 64 receives its source energy, such as a level of electrical current, from a heater controller 62. Heater controller 62, operating under instructions from control logic processor 60, allows adjustment of the vaporization energy provided at heater 64. Control loop schemes for vapor deposition can use any of a number of techniques known to those skilled in the process control arts. Control logic processor 60 could be a conventional computer workstation outfitted for signal sensing, calculation, and response, or could be a dedicated microprocessor or other type of logic control device suitable for executing control logic functions.

Of course, the basic control loop arrangement of FIG. 3 could also be applied to the embodiments of FIGS. 1 and 2. Where multiple component materials are used for a layer, more than one heater 64 or equivalent vaporization element can be controlled in a similar manner. Thus, precise control of the materials deposition process can be obtained using the measurement methods outlined above for obtaining thickness and materials composition data.

The method of the present invention allows measurement of deposited layer thickness on a transparent surface, even when the layer is actively being deposited, using interferometry. The method and apparatus of the present invention can also be employed, using fluorescence, to determine the relative amount of a deposited component material of the layer. Advantageously, embodiments of the present invention obtain measurements using a probe that is disposed behind the transparent surface and that is, therefore, effectively isolated from the deposition chamber. This arrangement can be used for low coherence interferometry, for fluorescence, and for other optical techniques such as a reflectometry apparatus or ellipsometry. Thus, unlike solutions using conventional deposition techniques, optical components are kept clean from deposits with this approach.

The apparatus and method of the present invention are particularly advantaged for determining thickness and rate of change of thickness of a layer during active coating of OLED materials. The apparatus and methods of the present invention can be installed within the vacuum chamber, as shown in FIGS. 1-3 or can be installed in some other suitable environment, including standard ambient environments. This apparatus can be used for measuring thickness of a single layer on a substrate as well as for components having multiple overlaid patterned layers. Thus, for example, the apparatus of the present invention could be used to obtain thickness measurements from a complete, fabricated, multilayer thin-film component. Measurements can be made with probe 18 either stationary or moving in a scan pattern or with the sampled area either stationary or moving. Conventional transport mechanisms, well known in the instrumentation scanning arts, can be used to provide relative movement between scanning probe 18 and the sampled area of layer 24 (FIGS. 1-3).

It is also expected that optical reflectometry or ellipsometry can also be utilized in combination with this approach. In all cases, as the thickness of the coating changes with time, the observed optical signal changes in a predictable and measurable manner. For the low coherence interferometry case, as the laydown thickness increases, the effective central peak position of an optical interface changes. For fluorescence, the fluorescence intensity changes with thickness in a known manner. With reflectometry, the channel spectrum changes in a predictable manner.

The techniques of the present invention used both individually and combined, can work together to provide an optical deposition rate and total laydown thickness monitor having a wide dynamic range. In addition, fluorescence can also be utilized to measure concentration of dopants in a host material by observing the effects of the dopant on the emission spectra.

There can be some limitations due to interference effects in the films which cause non-linear behavior in both the interferometry and fluorescence data and spectral shifts in the fluorescence data. For the interferometric data, however, this non-linear behavior is generally observed at thicknesses above the region of interest for OLED deposition.

Optionally, witness plates and appropriate masks can be added to non used portions of the coater and motherboard to enable measurement of rates at off axis regions. The witness plates can include cassettes or carousels to renew the region for sensing so that only individual coatings are being observed at any one time. Similarly, with appropriate masks, individual or multiple coatings can be observed. Also the optical sensors can be moved to appropriate measurement locations if desired.

The invention has been described in detail with particular reference to certain preferred embodiments thereof, but it will be understood that variations and modifications can be effected within the spirit and scope of the invention.

PARTS LIST 1, 2, 3 Port
10 Interferometer
12, 16 Optical Fiber
14 Fiber Optic Feedthrough
18 Optical Probe
20 Lens
22 Substrate
24 Coating Layer
25 Lightbeam Path
26 Deposition source
27, 29, 31 Optical Interface
28 Orifice
30 Vacuum Chamber Base
32 Side Wall/Vacuum Chamber Wall
34 Substrate Support Member
36 Probe mount
37 Vapor Plume
40 Excitation Light Source
42 Detector
44 Excitation Fiber
46 Collection Fiber
48 Lens
50 Fluorescence Light Path
52 Filter
54 Angle
60 Control Logic Processor
62 Heater Controller
64 Heater
75 Interferometer
76 Broadband Light Source
77 Broadband Source Optical Fiber
78 Fiber Optical Circulator
79 Optical Fiber
81 Collimator
86 Optical Head
84, 86 Beam
85 Beam Splitter Cube
87, 88, Hollow Cube Retroreflector
89 Platform
90 Shaft
91 Brushless DC Motor Drive
92, 93 Output Beam
94 Notch Filter
95 Bandpass Filter
96 Laser Interference Detector
97 Low-Coherence Light Interference Detector
98 Computer
99 Signal Processing Electronics
100 Power Supply 101 Coherent Source
102, 104, 105, 110, 111, 112, 113 Optical Fiber
103, 107 Wavelength Division Multiplexer (WDM)
106 Fiber Optic Coupler
108, 109 Piezoelectric Modulator
114, 115 Mirror
116 WDM
117 Optical Fiber
120 Witness Plate
122 Sample
124 Aperture
126 Aperture Plate
200 Measurement System
202 Vacuum Chamber

The invention claimed is:

1. A method of calculating the thickness or the rate of change of thickness of a layer having at least one component capable of light emission when illuminated by light as the layer is being formed on a substrate, comprising:
  a) illuminating the layer through the substrate with light that transmits through the layer and causes the light emission component to emit light by transporting an excitation fiber and wherein the emitted light is collected by a collection fiber with the excitation fiber and the collection fiber forming an angle of 20-25 degrees;
  b) collecting a portion of the light emission from the component of the layer through the substrate;
  c) calculating the layer thickness or the rate of change of layer thickness based on the intensity of the light emission from the component of the layer; and
  d) storing or displaying the resultant thickness or rate of change of thickness of the layer.

2. The method of claim 1 wherein the step of collecting a portion of the light emission comprises filtering a portion of the emitted light.

3. The method of claim 1 further including providing a diffuser over the substrate.

4. The method of claim 1 wherein the thickness is calculated by comparing the intensity of emitted light to a previous intensity related to a known thickness for that component.

5. The method of claim 1 wherein the thickness is calculated by comparing the intensity of emitted light at the current coating layer thickness to previous intensities for the same layer at earlier thicknesses and fitting the current coating layer intensity to a model of the interference effect of intensity vs. thickness.

6. A method of calculating the thickness or rate of change of thickness and the relative concentrations of components of a layer, as the layer is being formed on a substrate, wherein at least two different components are capable of light emission when illuminated by light, comprising:
  a) illuminating the layer through the substrate with light that transmits through the layer and causes the at least two light emission components to emit light;
  b) collecting, though the substrate, a portion of the light emission from the components of the layer;
  c) collecting a portion of the reflected light from each optical interface of the substrate and layer with a low coherence interferometer to provide interferometric data and wherein a second light source is used for producing the reflected light, and wherein the wavelengths of the light produced by the first and second light sources are distinct;
  d) analyzing the resulting interferometric data to calculate the thickness or the rate of change of thickness of the layer;
  e) calculating the relative concentrations of the components according to the relative intensities of the collected light emission wherein the ratio of the intensity from a first wavelength of a first set of wavelengths where the emission originates predominantly from a first component, to the intensity from a second wavelength of a second set of wavelengths where the emission originates predominantly from a second component corresponds to the concentration ratio of the two different components; and
  f) storing or displaying the thickness or the rate of change of thickness of the layer and relative concentrations of the components.

7. The method of claim 6 further including calculating the concentrations of the components by using the calculated thickness and the calculated relative concentrations.

8. The method of claim 7 wherein the step of collecting a portion of the light emission comprises filtering a portion of the emitted light.

9. The method of claim 7 wherein the illuminating light is transported by an excitation fiber and the emitted light is collected by a collection fiber.

10. The method of claim 7 further including providing a diffuser over the substrate.

11. The method of claim 7 wherein the thickness is calculated by comparing the intensity of emitted light to a previous intensity related to a known thickness for that component.

12. The method of claim 7 wherein the thickness is calculated by comparing the intensity of emitted light at the current coating layer thickness to previous intensifies for the same layer at earlier thicknesses and fitting the current coating layer intensity to a model of the interference effect of intensity vs. thickness.

13. The method of claim 6 wherein the step of collecting a portion of the light emission comprises filtering a portion of the emitted light.

14. The method of claim 6 wherein the illuminating light is transported by an excitation fiber and the emitted light is collected by a collection fiber.

15. The method of claim 6 further including providing a diffuser over The substrate.

16. The method of claim 6 wherein the thickness is calculated by comparing the intensity of emitted light to a previous intensity related to a known thickness for that component.

17. The method of claim 6 wherein the thickness is calculated by comparing the intensity of emitted light at the current coating layer thickness to previous intensifies for the same layer at earlier thicknesses and fitting the current coating layer intensity to a model of the interference effect of intensity vs. thickness.

* * * * *